US008818311B2

(12) United States Patent
Persico et al.

(10) Patent No.: US 8,818,311 B2
(45) Date of Patent: Aug. 26, 2014

(54) APPARATUS AND METHOD OF HARMONIC SELECTION FOR MIXING WITH A RECEIVED SIGNAL

(71) Applicant: QUALCOMM Incorporated, San Diego, CA (US)

(72) Inventors: Charles J. Persico, San Diego, CA (US); Jeremy D. Dunworth, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/725,151

(22) Filed: Dec. 21, 2012

(65) Prior Publication Data

US 2014/0179251 A1 Jun. 26, 2014

(51) Int. Cl.
*H04B 17/00* (2006.01)

(52) U.S. Cl.
USPC .......................................................... 455/226.2

(58) Field of Classification Search
USPC ........... 455/208, 216, 226.2, 232.1, 255–258, 455/318, 343.5
See application file for complete search history.

(56) References Cited

U.S. PATENT DOCUMENTS 5,487,186 A 1/1996 Scarpa
5,847,613 A 12/1998 Langlet et al.
6,738,609 B1 5/2004 Clifford
7,317,774 B2 1/2008 Richey et al.
7,961,040 B2 6/2011 Xu
8,102,943 B1 * 1/2012 Khlat et al. .................. 375/316

* cited by examiner

*Primary Examiner* — Christian Hannon
(74) *Attorney, Agent, or Firm* — Kenyon S. Jenckes

(57) ABSTRACT

A method of harmonic selection for mixing with a received signal includes receiving a radio frequency (RF) signal and determining a variable gain setting from among a plurality of gain settings or from a range of gain settings. The variable gain setting is based on the RF signal. The method further includes selecting a harmonic to provide to an input of a mixer to generate an output signal. A baseband signal or an intermediate frequency signal is generated from the output signal. The harmonic is selected based on the variable gain setting. An apparatus includes a harmonic selector that is configured to generate an indication of a selected harmonic. The harmonic is selected based on a variable gain setting determined from among a plurality of gain settings or from a range of gain settings. Based on the selected harmonic, a mixer generates an output signal. A baseband signal or an intermediate signal is generated from the output signal.

25 Claims, 12 Drawing Sheets

APPARATUS AND METHOD OF HARMONIC SELECTION FOR MIXING WITH A RECEIVED SIGNAL

I. FIELD

The present disclosure is generally related to adjusting a signal gain using harmonic mixing.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

In direct-conversion radio frequency (RF) receivers, an RF signal may be received by an antenna and the RF signal may be mixed or multiplied with a local oscillator signal at a RF frequency that matches a carrier frequency of the RF signal to generate a baseband signal. Receivers may be designed to accommodate a high dynamic range of received signals. In addition, receivers may be designed to have high sensitivity circuitry to provide accurate signal detection results for low-strength signals. For received signals that have higher strengths, due to the sensitivity of the receiver circuitry, the receiver may perform signal gain reductions to reduce receiver overload. Such signal gain reductions introduce the opportunity for the receiver to use less power, and thus drain less energy from a battery of a wireless communication device.

III. SUMMARY

A baseband signal may be generated by mixing a radio frequency (RF) signal having a carrier frequency with a local oscillator (LO) signal generated from a local oscillator with an adjustable frequency setting. The signal strength (i.e., power level) of the RF signal may be determined by measuring the signal strength of the baseband signal. Based on the signal strength of the baseband signal, the frequency of the LO signal may be adjusted to change a gain resulting from mixing the RF signal with the LO signal. For example, when the signal strength of the RF signal increases (e.g., corresponding to an increased signal strength of the baseband signal), rather than the LO signal having a first harmonic matching the carrier frequency, a frequency of the LO signal may be reduced so that a higher harmonic of the LO signal matches the carrier frequency to reduce the gain of the resulting baseband signal. Alternatively, when the signal strength of the RF signal decreases (e.g., corresponding to a decreased signal strength of the baseband signal), a frequency of the LO signal may be increased so that a lower harmonic of the LO signal matches the carrier frequency to increase the gain of the resulting baseband signal.

In a particular embodiment, a method of harmonic selection for mixing with a received signal includes receiving a radio frequency (RF) signal and determining a variable gain setting from among a plurality of gain settings or from a range of gain settings. The variable gain setting is based on the RF signal. The method further includes selecting a harmonic to provide to an input of a mixer to generate an output signal. A baseband signal or an intermediate frequency signal is generated from the output signal. The harmonic is selected based on the variable gain setting.

In another particular embodiment, an apparatus includes a harmonic selector that is configured to generate an indication of a selected harmonic. The harmonic is selected based on a variable gain setting determined from among a plurality of gain settings or from a range of gain settings. Based on the selected harmonic, a mixer generates an output signal. A baseband signal or an intermediate signal is generated from the output signal.

In another particular embodiment, a method of processing a signal includes mixing a received radio frequency (RF) signal with a local oscillator signal to generate an output signal. The local oscillator signal is at a lower frequency than the RF signal and the lower frequency is based on a signal strength measurement of a signal derived from the RF signal. The method further includes filtering the output signal to select a filtered output signal.

In another particular embodiment, an apparatus includes a mixer that is configured to receive a radio frequency (RF) signal and a local oscillator signal. The mixer is further configured to generate an output signal based on the RF signal and the local oscillator signal. The local oscillator signal is at a lower frequency than the RF signal and the lower frequency is based on a signal strength measurement of a signal derived from the RF signal. The apparatus further includes a filter that is configured to filter the output signal to select a filtered signal.

One particular advantage provided by at least one of the disclosed embodiments is an ability to save energy and reduce battery drainage by reducing a gain amount of a signal by lowering the mixer local oscillator frequency. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
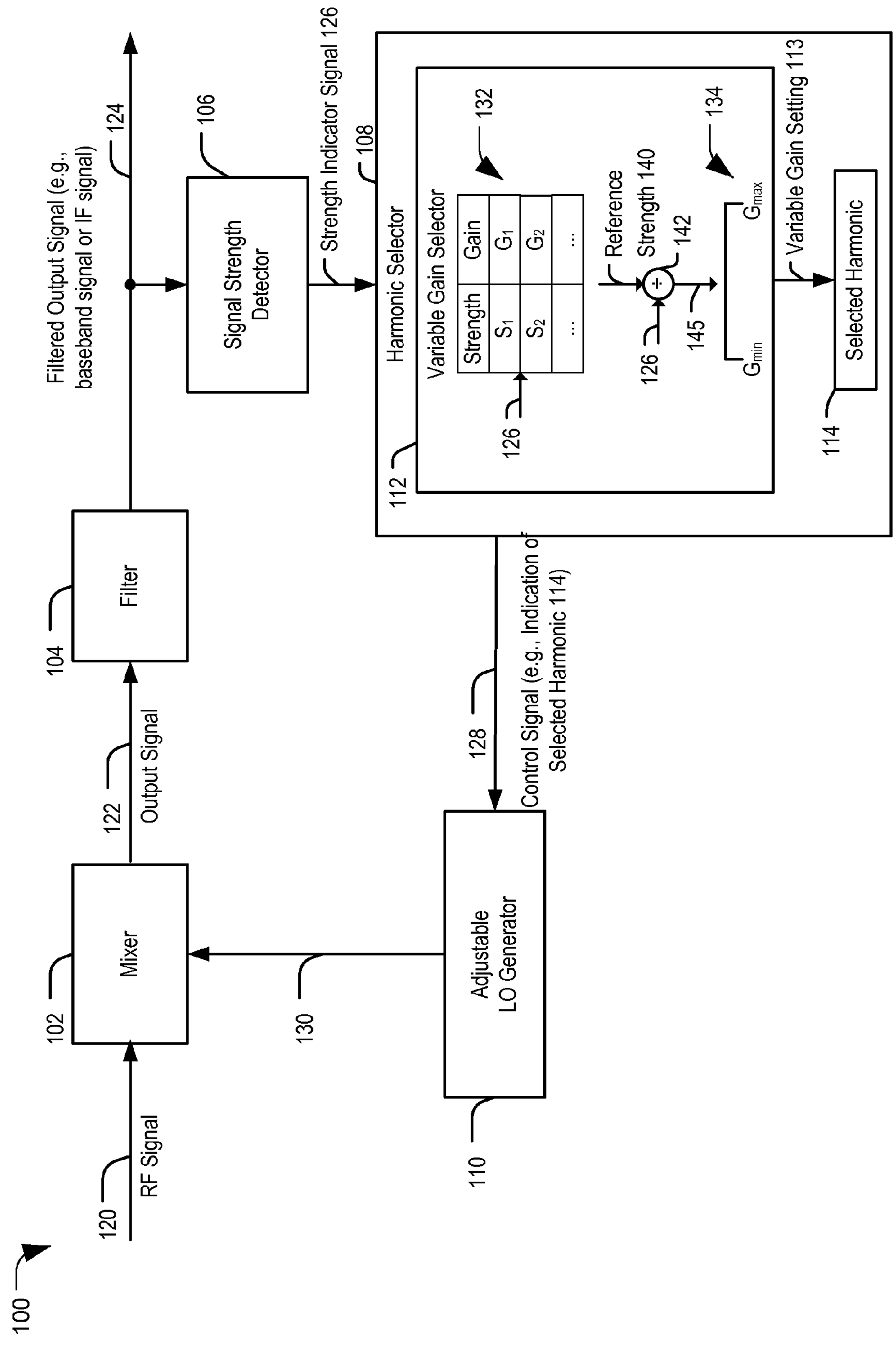
FIG. 1 is a block diagram of a particular illustrative embodiment of a system operable to select a harmonic for mixing with a received signal.

Referring to FIG. 1, a particular illustrative embodiment of a system 100 that is operable to select a harmonic for mixing with a received signal is shown. The system 100 includes a mixer 102, a filter 104, a signal strength detector 106, a harmonic selector 108, and an adjustable local oscillator (LO) generator 110.

The mixer 102 is configured to receive a radio frequency (RF) signal 120 having a carrier frequency ($f_C$) at a first input and a LO signal 130 having a LO frequency ($f_{LO}$) at a second input. The LO signal 130 may be a square wave where the LO frequency ($f_{LO}$) is 1/N times the carrier frequency ($f_C$), where N is an odd integer. Consequently, the LO signal 130 may be a square wave with frequency components at each odd harmonic, including the fundamental harmonic. For example, the LO frequency ($f_{LO}$) may be equal to the carrier frequency ($f_C$) of the RF signal 120 (e.g., $f_{LO}=f_C$) and the LO signal 130 may have a fundamental (i.e., first) harmonic at a frequency that matches the carrier frequency ($f_C$). Alternatively, the LO frequency ($f_{LO}$) fraction may be a action of the carrier frequency ($f_C$) and the LO signal 130 may have a corresponding harmonic at a frequency that matches the carrier frequency ($f_C$). For example, the LO signal 130 has a third harmonic at a frequency that matches the carrier frequency ($f_C$) when the LO frequency ($f_{LO}$) is equal to one-third the carrier frequency ($f_C$) (e.g., $f_{LO}=f_C/3$), the LO signal 130 has a fifth harmonic at a frequency that matches the carrier frequency ($f_C$) when the LO frequency ($f_{LO}$) is equal to one-fifth of the carrier frequency ($f_C$) (e.g., $f_{LO}=f_C/5$), and the LO signal 130 has a seventh harmonic at a frequency that matches the carrier frequency ($f_C$) when the LO frequency ($f_{LO}$) is equal to one-seventh of the carrier frequency ($f_C$) (e.g., $f_{LO}=f_C/7$). The mixer 102 is further configured to mix the RF signal 120 with the LO signal 130 to generate an output signal 122 (i.e., a resulting mixed signal). The LO signal 130 may be at a lower frequency than the RF signal 120. As explained below, the lower frequency may be based on a measured signal strength of a signal derived from the RF signal 120. The frequency of the LO signal 130 may affect a conversion gain of the mixer 102. For example, when the frequency of the LO signal 130 is reduced based on a selected harmonic (as will be described below), the conversion gain of the mixer 102 decreases, resulting in the output signal 122 having a lower signal strength. The output signal 122 is provided to the input of the filter 104. The output signal 122 may be an intermediate frequency (IF) signal or a baseband signal. It is important to note that the LO does not have to be a square wave with 50% duty cycle. The LO could have any duty cycle that is used in RF mixers, such as 50%, 33%, 25% or 12.5%, as long as the relationship between the LO frequency ($f_{LO}$) and the carrier frequency ($f_C$) is controlled as described above.

The filter 104 is configured to receive the output signal 122 and to generate a filtered output signal 124 (i.e., a filtered IF signal or a filtered baseband signal). In a particular embodiment, the filter 104 may be a low pass filter that is configured to filter high frequency components of the output signal 122. In another particular embodiment, the filter 104 may be a bandpass filter. The filtered output signal 124 is provided to the input of the signal strength detector 106. The filtered output signal 124 may include an in-phase component and a quadrature component.

The signal strength detector 106 is configured to determine a signal strength of the filtered output signal 124. For example, the signal strength detector 106 may measure the signal strength of the filtered output signal 124 and generate a strength indicator signal 126 indicating the signal strength of the filtered output signal 124. The signal strength of the filtered output signal 124 may correspond to a signal strength of the RF signal 120 received by the mixer 102. For example, as the signal strength of the RF signal 120 increases, the signal strength of the filtered output signal 124 may also increase. In addition, as the signal strength of the RF signal 120 decreases, the signal strength of the filtered output signal 124 may also decrease. The strength indicator signal 126 is provided to the input of the harmonic selector 108.

The harmonic selector 108 is configured to receive the strength indicator signal 126 and to determine a variable gain setting 113 based on the strength indicator signal 126. For example, the harmonic selector 108 may include a variable gain selector 112 that is configured to determine the variable gain setting 113. The variable gain setting 113 may correspond to a particular frequency of the LO signal 130 that, when applied by the adjustable LO generator 110 to the mixer 102 along with the RF signal 120, results in the output signal 122 having a selected signal strength.

The variable gain selector 112 may determine or select a gain setting (i.e., the variable gain setting 113) from among a plurality of discrete gain settings 132. For example, the variable gain selector 112 may include a plurality of discrete gain settings 132 corresponding to a plurality of signal strength threshold values. In response to receiving the strength indicator signal 126, the variable gain selector 112 may determine whether the signal strength of the RF signal 120 satisfies a first threshold value ($S_1$) (e.g., determine whether the signal strength exceeds or is equal to the first threshold value ($S_1$) or determine whether the signal strength is below the first threshold value ($S_1$)). In response to a determination that the signal strength of the RF signal 120 satisfies the first threshold value ($S_1$), the variable gain selector 112 may select a first variable gain setting ($G_1$) as the variable gain setting 113. The first variable gain setting ($G_1$) may be selected from the plurality of discrete gain settings 132 (i.e., $G_1$, $G_2$, etc.). In response to a determination that the signal strength of the RF signal 120 fails to satisfy the first threshold value ($S_1$), the variable gain selector 112 may select a second variable gain setting ($G_2$) as the variable gain setting 113. The second variable gain setting ($G_2$) may be selected from the plurality of discrete gain settings 132. In a particular embodiment, the variable gain selector 112 may compare the signal strength of the RF signal 120 to multiple threshold values (e.g., the first threshold value ($S_1$), a second threshold value ($S_2$), a third threshold value, etc.) until the signal strength of the RF signal 120 is determined to satisfy a threshold value. Each threshold value may correspond to a particular gain setting (e.g., $G_1$, $G_2$, etc.).

Alternatively, the variable gain selector 112 may determine or select a gain setting (i.e., the variable gain setting 113) from among a range of gain settings 134 (e.g., a continuous range) from a first gain setting ($G_{min}$) to a second gain setting ($G_{max}$) and may compare the selected gain setting to one or more gain levels that may be provided by harmonics that are generated at the adjustable LO generator 110. For example, the variable gain selector 112 may provide the strength indicator signal 126 to a divider 142 and provide a reference strength signal 140 to the divider 142. The reference strength signal 140 may correspond to a "target" signal strength of the filtered output signal 124. The divider 142 may generate a comparison signal 145 indicative of a recommended gain. The recommended gain may correspond to a gain at the mixer 102 that results in the reference strength signal 140 and the strength indicator signal 126 having approximately equal values. The variable gain selector 112 may determine a gain setting (i.e., the variable gain setting 113) within the range of gain settings 134 (i.e., $G_{min}$ to $G_{max}$) that corresponds to the recommended gain. The variable gain selector 112 may adjust the variable gain setting 113, that the variable gain setting 113 lies within the range 134. The variable gain selector 112 may also adjust the variable gain setting 113 along the range 134 to compensate for environmental effects, such as process, voltage, and temperature variations. It will be appreciated that adjusting the variable gain setting 113 along a continuous range may provide a more precise gain setting as compared to selecting from discrete gain settings.

Although the variable gain selector 112 is illustrated as determining the variable gain setting 113 via comparisons of signal strength or via a division operation at the divider 142, in other embodiments the variable gain selector 112 may determine the variable gain setting 113 via one or more other mechanisms. Further, although the variable gain setting 113 is described as being determined based on the strength indicator signal 126, one or more other factors may be used to determine the variable gain setting 113. For example, the strength indicator signal 126 is indicative of a strength of the filtered output signal 124 that is subject to a gain being applied at the mixer 102 when the filtered output signal 124 is generated. When the signal strength detector 106 generates the strength indicator signal 126, the gain being applied at the mixer 102 is to be accounted for when selecting the variable gain setting 113. The gain applied at the mixer 102 may be accounted for by selecting the variable gain setting 113 from the plurality of discrete gain settings 132 based on the strength indicator signal 126 and also based on the currently applied gain, or by adjusting (e.g., multiplying) the comparison signal 145 based on the currently applied gain, as illustrative, non-limiting examples.

The harmonic selector 108 is further configured to select a harmonic 114 corresponding to the selected gain setting. The harmonic selector 108 may select the harmonic 114 based on the variable gain setting 113 determined from among the plurality of discrete gain settings 132 or from a setting within the range of gain settings 134. The harmonic selector 108 is further configured to generate a control signal 128 based on the selected harmonic 114. For example, the control signal 128 may be an indication of the selected harmonic 114. The control signal 128 is provided to the input of the adjustable LO generator 110. In a particular embodiment, the harmonic selector 108 may include a processor and a memory coupled to the processor. The memory may include gain settings that include the plurality of discrete gain settings 132, the range of gain settings 134, or any combination thereof, and the processor may select the gain setting from memory based on the strength indicator signal 126.

The adjustable LO generator 110 is configured to receive the control signal 128 and to generate the LO signal 130 having a LO frequency ($f_{LO}$) that corresponds to the harmonic selected by the harmonic selector 108. For example, the LO frequency ($f_{LO}$) may be equal to the carrier frequency ($f_C$) of the RF signal 120 (e.g., $f_{LO}=f_C$) if the selected harmonic corresponds to the fundamental harmonic (i.e., the first harmonic). Alternatively, the LO frequency ($f_{LO}$) may be equal to a fraction of the carrier frequency ($f_C$) that corresponds to the selected harmonic. For example, if the selected harmonic is the third harmonic, the LO frequency ($f_{LO}$) of the LO signal 130 may be equal to one-third the carrier frequency ($f_C$) (e.g., $f_{LO}=f_C/3$). The adjustable LO generator 110 is further configured to provide the LO signal 130 to the second input of the mixer 102.

During operation, an initiation procedure may be performed and an antenna of a mobile communication device may receive the RF signal 120 having a carrier frequency ($f_C$) (e.g., $f_C$=850 MHz) and provide the RF signal 120 to the first input of the mixer 102. The mixer 102 also receives the LO signal 130 having an LO frequency ($f_{LO}$) that is equal to or substantially equal to the carrier frequency ($f_C$) (e.g., $f_{LO}=f_C$=850 MHz). When the LO signal 130 has the fundamental harmonic (e.g., $f_{LO}=f_C$=850 MHz), the mixer 102 may apply an initial gain during generation of the output signal 122. The mixer 102 mixes the RF signal 120 with the LO signal 130 to generate the output signal 122 and provides the output signal 122 to the filter 104.

The filter 104 filters the output signal 122 and generates the filtered output signal 124. The filter 104 provides the filtered output signal 124 to the signal strength detector 106. The signal strength detector 106 detects the filtered output signal 124 and determines a signal strength corresponding to the filtered output signal 124. The signal strength detector 106 generates the strength indicator signal 126 indicating the signal strength of the filtered output signal 124 and provides the strength indicator signal 126 to the harmonic selector 108.

In response to receiving the strength indicator signal 126, the harmonic selector 108 selects a gain setting based on the strength indicator signal 126 and selects a harmonic for the LO signal 130 based on the determined gain setting. For example, for a 50% duty cycle LO, the harmonic selector 108 may select a −9.5 dB gain setting corresponding to a third harmonic, a −13.98 dB gain setting corresponding to a fifth harmonic, or a −16.90 dB gain setting corresponding to a seventh harmonic. If the harmonic selector 108 determines that a 0 dB gain setting corresponds to the signal strength of the filtered output signal 124, the harmonic selector 108 may select the fundamental harmonic. The harmonic selector 108 generates the control signal 128 indicating the selected harmonic and provides the control signal 128 to the adjustable LO generator 110. Table 1 provides example gain settings for four different LO duty cycles.

TABLE 1

| Duty Cycle | $1^{st}$ Harmonic Relative Gain | $3^{rd}$ Harmonic Relative Gain | $5^{th}$ Harmonic Relative Gain | $7^{th}$ Harmonic Relative Gain |
|---|---|---|---|---|
| 50% | 0 dB | −9.5 dB | −13.98 dB | −16.9 dB |
| 33% | 0 dB | −38.3 dB | −13.68 dB | −17.25 dB |
| 25% | 0 dB | −9.5 dB | −13.98 dB | −16.9 dB |
| 12.5% | 0 dB | −1.9 dB | −6.32 dB | −16.9 dB |

The adjustable LO generator 110 generates the LO signal 130 having a LO frequency ($f_{LO}$) corresponding to the selected harmonic. The conversion gain at the mixer 102 relative to the conversion gain when the LO is at substantially the same frequency as the carrier frequency may be equal to −20*logN, where N corresponds to the selected harmonic. For example, if the selected harmonic is the third harmonic, the LO frequency ($f_{LO}$) may be equal to one-third of the carrier frequency ($f_C$) (e.g., $f_{LO}$=850 MHz/3=283.33 MHz) and the relative conversion gain may be equal to −20*log 3 (i.e., −9.5 dB). Alternatively, if the selected harmonic is the fifth harmonic, the LO frequency ($f_{LO}$) may be equal to one-fifth of the carrier frequency ($f_C$) (e.g., $f_{LO}$=850 MHz/5=170 MHz) and the relative conversion gain may be equal to −20*log 5 (i.e., −13.98 dB). If the selected harmonic is the seventh harmonic, the LO frequency ($f_{LO}$) may be equal to one-seventh of the carrier frequency ($f_C$) (e.g., $f_{LO}$=850 MHz/7=121.43 MHz) and the relative conversion gain may be equal to −20*log 7 (i.e., −16.90 dB). Thus, the conversion gain at the mixer 102 may be adjusted based on the selected harmonic. As noted above, for different LO duty cycles, the conversion gain may have a different function vs. LO frequency.

It will be appreciated that adjusting the conversion gain at the mixer 102 during generation of the output signal 122 using harmonics may reduce power consumption. For example, because each selected harmonic other than the fundamental harmonic has a lower mixer conversion gain than the fundamental harmonic, use of a separate gain reduction circuit may be avoided (or an amount of gain reduction provided by a gain reduction stage may be reduced), thereby saving energy and reducing battery drain. Additionally, because the selected harmonic can be at a lower frequency, less power is used in buffering the LO signal from the LO generator to the mixer, which can be a significant contributor to overall power consumption if LO generator and mixer are located far away from each other. Further, the system 100 of FIG. 1 may be used in receivers designed to receive strong signals and weak signals. The adjustable LO generator 110 may be adjusted for higher strength signals and for low strength signals (e.g., in response to a received signal strength indicator (RSSI) measurement of the filtered output signal 124). Adjustment of the LO frequency ($f_{LO}$) may be made upon the first detection of the filtered output signal 124 or after an initial sampling period.

Figure 2:
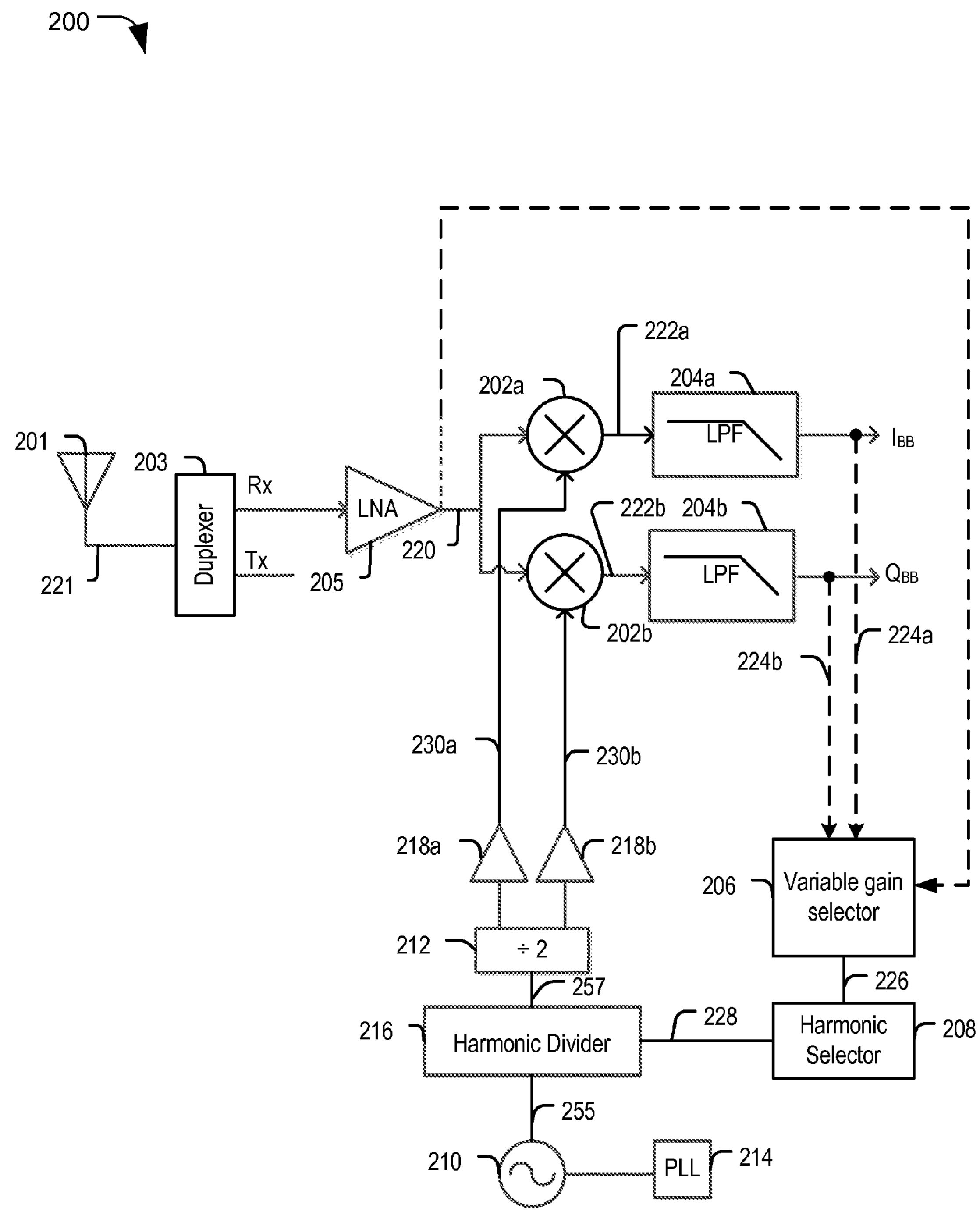
FIG. 2 is a block diagram of another particular illustrative embodiment of a system operable to select a harmonic for mixing with a received signal.

Referring to FIG. 2, another particular illustrative embodiment of a system 200 that is operable to select a harmonic for mixing with a received signal is shown. The system 200 includes an antenna 201, a duplexer 203, a low noise amplifier (LNA) 205, a first mixer 202*a*, a second mixer 202*b*, a first low pass filter (LPF) 204*a*, a second LPF 204*b*, a variable gain selector 206, a harmonic selector 208, a harmonic divider 216, a voltage controlled oscillator (VCO) 210, and a phase locked loop (PLL) 214.

The antenna 201 is configured to receive an incoming signal 221 having a carrier frequency ($f_C$) and to provide the incoming signal 221 to the LNA 205 via the reception path (Rx) of the duplexer 203. The duplexer 203 may also include a transmission path (Tx) configured to provide an outgoing signal to the antenna 201 for transmission across a wireless network. The LNA 205 is configured to adjust the signal strength of the incoming signal 221 and to generate a radio-frequency (RF) signal 220 having the carrier frequency ($f_C$). The LNA 205 is further configured to provide the RF signal 220 to the first mixer 202*a* and to the second mixer 202*b*.

The first mixer 202*a* is configured to receive the RF signal 220 having the carrier frequency ($f_C$) at a first input and a first LO signal 230*a* having a LO frequency ($f_{LO}$) at a second input. As explained with respect to the LO signal 130 of FIG. 1, the first LO signal 230*a* may be a square wave where the LO frequency ($f_{LO}$) is 1/N times the carrier frequency ($f_C$), where N is an odd integer. Consequently, the first LO signal 230*a* may be a square wave with frequency components at each odd harmonic, including the fundamental harmonic. For example, the LO frequency ($f_{LO}$) may be equal to the carrier frequency ($f_C$) of the RF signal 120 (e.g., $f_{LO}$=$f_C$) when the first LO signal 230*a* has a fundamental (i.e., first) harmonic that matches the carrier frequency ($f_C$). Alternatively, the LO frequency ($f_{LO}$) may be a fraction of the carrier frequency ($f_C$) and the first LO signal 230*a* may have a corresponding harmonic that matches the carrier frequency ($f_C$). The first mixer 202*a* is further configured to mix the RF signal 220 with the first LO signal 230*a* to generate a first output signal 222*a*. The frequency of the first LO signal 230*a* may affect a conversion gain of the first mixer 202*a* and a resulting signal strength of the first output signal 222*a*. For example, when the frequency of the first LO signal 230*a* is reduced in response to a selected harmonic, the conversion gain of the first mixer 202*a* is also reduced, resulting in a lower signal strength of the first output signal 222*a*. The first output signal 222*a* may be an in-phase component of a baseband signal and the first LO signal 230*a* may be an in-phase component of a LO signal. The first mixer 202*a* is further configured to provide the first output signal 222*a* to an input of the first LPF 204*a*.

The second mixer 202*b* is configured to receive the RF signal 220 having the carrier frequency ($f_C$) at a first input and a second LO signal 230*b* having the LO frequency ($f_{LO}$) at a second input. The second mixer 202*b* is configured to operate in a similar manner as the first mixer 202*a* to generate a second output signal 222*b*. The second output signal 222*b* may be a quadrature component of a baseband signal and the second LO signal 230*b* may be a quadrature component of a LO signal. The second mixer 202*b* is further configured to provide the second output signal 222*b* to an input of the second LPF 204*b*.

The first LPF 204*a* is configured to filter the first output signal 222*a* and to generate a first baseband signal 224*a* (i.e., an in-phase component of the filtered output signal 124 of FIG. 1 ($I_{BB}$)) that is provided to an input of the variable gain selector 206. The second LPF 204*b* is configured to filter the second output signal 222*b* and to generate a second baseband signal 224*b* (i.e., a quadrature component of the filtered output signal 124 of FIG. 1 ($Q_{BB}$)) that is provided to an input of the variable gain selector 206.

The variable gain selector 206 is configured to detect the baseband signals 224*a*, 224*b*, the RF signal 220 from the LNA 205, or any combination thereof, and to determine the signal strength of one or more of the detected signals 224*a*, 224*b*, 220. For example, the variable gain selector 206 may measure the signal strength of the baseband signals 224*a*, 224*b*, the RF signal 220, or any combination thereof, in a manner similar to the signal strength detector 106 of FIG. 1. The variable gain selector 206 is further configured to select a variable gain setting that corresponds to the strength of the detected signal(s) 224*a*, 224*b*, and/or 220 such as in a manner similar to the variable gain selector 112 of FIG. 1. The variable gain selector 206 may select a gain setting (i.e., a variable gain setting) from among a plurality of discrete gain settings. Alternatively, the variable gain selector 206 may select a gain setting from among a continuous range of gain settings and compare the selected gain setting to one or more gain levels that may be provided by harmonics that can be generated by the harmonic divider 216. The variable gain selector 206 is further configured to generate a gain selection signal 226 based on the gain selection and to provide the gain selection signal 226 to the harmonic selector 208.

In a particular embodiment, the variable gain selector 206 may include a processor and a memory coupled to the processor. The memory may include gain settings such as the plurality of discrete gain settings, the range of gain settings, or any combination thereof, and the processor may select the gain setting from memory based on the signal strength of the baseband signals 224*a*, 224*b*, the RF signal 220, or any combination thereof.

The harmonic selector 208 is configured to select a harmonic corresponding to the selected gain setting and generate a control signal 228 based on the selected harmonic. For example, the selected harmonic may correspond to a particular frequency of the LO signals 230*a*, 230*b* that, when applied to the mixers 202*a*, 202*b* along with the RF signal 220, results in the output signals 222*a*, 222*b* having a selected gain. The harmonic selector 208 is further configured to provide the control signal 228 to the harmonic divider 216.

The PLL 214 is configured to provide a tuning voltage to the VCO 210. In response to receiving the tuning voltage, the VCO 210 is configured to generate a VCO signal 255 having a VCO frequency ($f_{VCO}$) that is substantially an integer multiple of the carrier frequency ($f_C$). For example, the VCO frequency ($f_{VCO}$) may be two times the carrier frequency ($f_C$) of the RF signal 220 (e.g., $f_{VCO}=2*f_C$). The VCO 210 is further configured to provide the VCO signal 255 to the harmonic divider 216.

The harmonic divider 216 (i.e., an adjustable frequency divider) is configured to receive the control signal 228 and the VCO signal 255 and to generate a signal 257. The harmonic divider 216 is further configured to adjust a frequency of the signal 257 to be a faction of the VCO frequency ($f_{VCO}$) of the VCO signal 255 based on the selected harmonic indicated by the control signal 228 so that the signal 257 has an adjusted frequency ($f_{ADJ}$). For example, the adjusted frequency ($f_{ADJ}$) may be equal to the VCO frequency ($f_{VCO}$) divided by the selected harmonic (e.g., $f_{ADJ}=f_{VCO}/N$, where N is the harmonic selected by the harmonic selector 208). The harmonic divider 216 is further configured to provide the signal 257 to the frequency divider circuit 212.

The frequency divider circuit 212 is configured to receive the signal 257 and to generate a first signal that is provided to the first LO buffer 218*a* to enable the first LO buffer 218*a* to generate the first LO signal 230*a*. The frequency divider 212 is further configured to generate a second signal that is provided to the second LO buffer 218*b* to enable the second LO buffer 218*b* to generate the second LO signal 230*b*. For example, the frequency divider circuit 212 may divide the adjusted frequency ($f_{ADJ}$) of the signal 257 by two to generate the first and second signals having the LO frequency ($f_{LO}$) (e.g., $f_{LO}=f_{ADJ}/2$) and having a ninety degrees phase difference. The first and second LO buffers 218*a*, 218*b* are configured to provide the first and second LO signals 230*a*, 230*b* to a second input of the first and second mixers 202*a*, 202*b*, respectively. The frequency divider circuit 212 can control the phase difference between first and second LO signals 230*a* and 230*b* so that the phase difference of the selected harmonic is ninety degrees. For example, when the $3^{rd}$ harmonic is selected the phase difference between first and second LO signals should be minus ninety degrees, in order that the phase difference between the $3^{rd}$ harmonic of LO signal 230*a* and LO signal 230*b* will be ninety degrees and the in-phase and quadrature baseband signals $I_{BB}$ and $Q_{BB}$ have the proper phase relationship.

During operation, the harmonic selector 208 and the harmonic divider 216 may be initialized so that the LO frequency ($f_{LO}$) is equal to the carrier frequency ($f_C$). The antenna 201 receives the incoming signal 221 having a carrier frequency ($f_C$) (e.g., $f_C$=850 MHz) and provides the incoming signal 221 to the LNA 205 through the reception path (Rx) of the duplexer 203. The LNA 205 may adjust the signal strength of the incoming signal 221 and provide the RF signal 220 (i.e., the adjusted incoming signal 221) to the first mixer 202*a* and to the second mixer 202*b*. For example, the LNA 205 may generate the RF signal 220 by amplifying or reducing the signal strength of the incoming signal 221.

The first mixer 202*a* receives the RF signal 220 and also receives the first LO signal 230*a* having a LO frequency ($f_{LO}$) equal to or substantially equal to the carrier frequency ($f_C$) (e.g., $f_{LO}$=850 MHz). The second mixer 202*b* receives the RF signal 220 and also receives the second LO signal 230*b* having a LO frequency ($f_{LO}$) equal to or substantially equal to the carrier frequency ($f_C$) (e.g., $f_{LO}$=850 MHz). The first mixer 202*a* mixes the RF signal 220 with the first LO signal 230*a* to generate the first output signal 222*a* and provides the first output signal 222*a* to the first LPF 204*a*. The second mixer 202*b* mixes the RF signal 220 with the second LO signal 230*b* to generate the second output signal 222*b* and provides the second output signal 222*b* to the second LPF 204*b*. Because the LO signals 230*a*, 230*b* and the RF signal 220 have substantially equal frequencies (e.g., $f_{LO}=f_C$), the relative conversion gain at the first and second mixers 202*a*, 202*b* is approximately equal to 0 dB and the signal strength of the first and second output signals 222*a*, 222*b* may be approximately equal to the signal strength of the RF signal 220.

The first LPF 204*a* filters the first output signal 222*a* to generate the first baseband signal 224*a* and the second LPF 222*b* filters the second output signal 222*b* to generate the second baseband signal 224*b*.

In a particular embodiment, the first LPF 204*a* provides the first baseband signal 224*a* to the variable gain selector 206 and the second LPF 204*a* provides the second baseband signal 224*b* to the variable gain selector 206. The variable gain selector 206 determines the signal strength of one or more of the baseband signals 224*a*, 224*b* and selects a gain setting for the baseband signals 224*a*, 224*b* that corresponds to the signal strength. For example, the variable gain selector 206 may select a 0 dB gain setting, a −9.5 dB gain setting, a −13.98 dB gain setting, or a −16.90 dB gain setting. In response to selecting the gain setting, the variable gain selector 206 generates the gain selection signal 226 based on the selection and provides the gain selection signal 226 to the harmonic selector 208.

In another particular embodiment, the LNA 205 provides the RF signal 220 to the variable gain selector 206. The variable gain selector 206 determines a signal strength of the RF signal 220 and selects a gain setting for the output signals 222*a*, 222*b*, the baseband signals 224*a*, 224*b*, or any combination thereof, that corresponds to the signal strength of the RF signal 220. For example, the variable gain selector 206 may select a 0 dB gain setting, a −9.5 dB gain setting, a −13.98 dB gain setting, or a −16.90 dB gain setting. In response to selecting the gain setting, the variable gain selector 206 generates the gain selection signal 226 based on the selection and provides the gain selection signal 226 to the harmonic selector 208.

The harmonic selector 208 selects a harmonic corresponding to the selected gain setting and generates the control signal 228 based on the selected harmonic. For example, the harmonic selector 208 may select the first harmonic (i.e., the fundamental harmonic) if the selected gain setting is equal to 0 dB, the harmonic selector 208 may select the third harmonic if the selected gain setting is equal to −9.5 dB, the fifth harmonic if the selected gain setting is equal to −13.98 dB, or the seventh harmonic if the selected gain setting is equal to −16.90 dB. As mentioned previously, the variable gains may be a function of the LO signal duty cycle. The harmonic selector 208 provides the control signal 228 indicating the selected harmonic to the harmonic divider 216.

The harmonic divider 216 selects a divisor (N) to apply to the VCO frequency ($f_{VCO}$) (e.g., $f_{VCO}$=1700 MHz) based on the selected harmonic indicated by the control signal 228 and generates the signal 257 having the adjusted frequency ($f_{ADJ}$) (e.g., $f_{ADJ}=f_{VCO}/N$). For example, if the selected harmonic is the third harmonic (N=3), the harmonic divider 216 generates the signal 257 having the adjusted frequency ($f_{ADJ}$) equal to one-third the VCO frequency ($f_{VCO}$) (e.g., $f_{ADJ}=f_{VCO}/3$=566.67 MHz). As another example, if the selected harmonic is the fifth harmonic (N=5), the harmonic divider 216 generates the signal 257 having the adjusted frequency ($f_{ADJ}$) equal to one-fifth the VCO frequency ($f_{VCO}$) (e.g., $f_{ADJ}$=340 MHz). Further, if the selected harmonic is the seventh harmonic (N=7), the harmonic divider 216 generates the signal 257 having the adjusted frequency ($f_{ADJ}$) equal to one-seventh the VCO frequency ($f_{VCO}$) (e.g., $f_{ADJ}$=242.86 MHz). The harmonic divider 216 provides the signal 257 to the frequency divider circuit 212.

The first and second LO signals 230*a*, 230*b* having the LO frequency ($f_{LO}$) are generated by the first and second LO buffers 218*a*, 218*b*, respectively, in response to receiving the first and second signals from the frequency divider 212. The frequency divider circuit 212 divides the adjusted frequency ($f_{ADJ}$) of the signal 257 by two to generate signals having the LO frequency ($f_{LO}$) (e.g., $f_{LO}=f_{ADJ}/2$). For example, when the control signal 228 corresponds to the third harmonic, the LO frequency ($f_{LO}$) may be equal to 283.34 MHz (e.g., 566.67 MHz/2). Thus, the adjusting the control signal 228 results in adjusting the LO frequency ($f_{LO}$). The first and second LO buffers 218*a*, 218*b* provide the first and second LO signals 230*a*, 230*b* to the first and second mixer 202*a*, 202*b*, respectively.

As explained with respect to the mixer 102 of FIG. 1, the relative conversion gain of the first mixer 202*a* and the second mixer 202*b* may be equal to −20*logN, where N corresponds to the selected harmonic. As mentioned previously, the conversion gain of the first mixer 202*a* and second mixer 202*b* may also be a different function of N, depending on the LO signal duty cycle.

It will be appreciated that the system 200 of FIG. 2 may be used in receivers designed to receive strong signals and weak signals. Further, additional power savings may be realized as the selected harmonic increases and as the LO frequency ($f_{LO}$) is reduced. For example, the additional power savings may occur because distributing the LO signals 230*a*, 230*b* to the mixers 202*a*, 202*b* may consume less power at the LO buffers 218*a*, 218*b* when the LO signals 230*a*, 230*b* are at a lower frequency as compared to the VCO signal 255.

Figure 3:
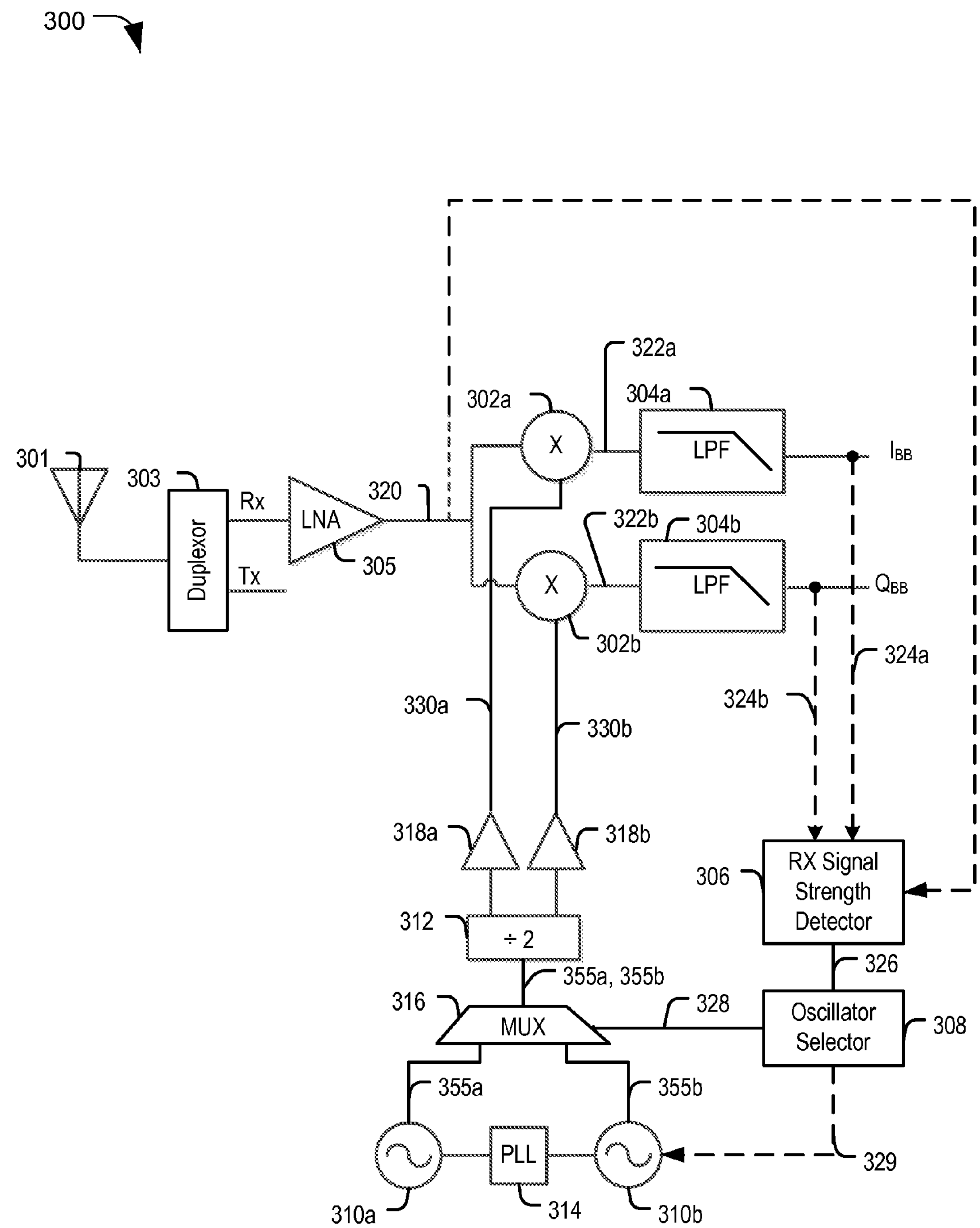
FIG. 3 is a block diagram of another particular illustrative embodiment of a system operable to select a harmonic for mixing with a received signal.

Referring to FIG. 3, another particular illustrative embodiment of a system 300 that is operable to select a harmonic for mixing with a received signal is shown. The system 300 includes an antenna 301, a duplexer 303, a low noise amplifier (LNA) 305, a first mixer 302*a*, a second mixer 302*b*, a first low pass filter (LPF) 304*a*, a second LPF 304*b*, an RX signal strength detector 306, an oscillator selector 308, a multiplexer 316, a first voltage controlled oscillator (VCO) 310*a*, a second VCO 310*b*, a phase locked loop (PLL) 314, a frequency divider circuit 312, a first LO buffer 318*a*, and a second LO buffer 318*b*.

The antenna 301, the duplexer 303, the LNA 305, the first mixer 302*a*, the second mixer 302*b*, the first LPF 304*a*, the second LPF 304*b*, the frequency divider circuit 312, the first LO buffer 318*a*, and the second LO buffer 318*b* correspond to the antenna 201, the duplexer 203, the LNA 205, the first mixer 202*a*, the second mixer 202*b*, the first LPF 204*a*, the second LPF 204*b*, the frequency divider circuit 212, the first LO buffer 218*a*, and the second LO buffer 218*b*, respectively, of FIG. 2 and operate in a substantially similar manner as described with respect to the corresponding components of FIG. 2. In contrast to the harmonic divider 216 of FIG. 2, the multiplexer 316 selects from a first VCO signal 355*a* from the first VCO 310*a* and a second VCO signal 355*b* from the second VCO 310*b*.

The RX signal strength detector 306 is configured to receive an RF signal 320 from the LNA 305, a first baseband signal 324*a* from the first LPF 304*a*, a second baseband signal 234*b* from the second LPF 304*b*, or any combination thereof, and to determine a signal strength measurement corresponding to a power level of at least one of the detected signals 320, 324*a*, 324*b*. More accurate results may be obtained via the first and second baseband signals 324*a*, 324*b* corresponding to a signal level of interest as compared to the signal strength of the entire RF band (e.g., the RF signal 320). The RX signal strength detector 306 is further configured to generate a strength indicator signal 326 based on the signal strength measurement and to provide the strength indicator signal 326 to the oscillator selector 308.

The oscillator selector 308 is configured to select a variable gain setting that corresponds to the signal strength measurement in response to receiving the strength indicator signal 326. The oscillator selector 308 may select a gain setting (i.e., a variable gain setting) from among a plurality of discrete gain settings. Alternatively, the oscillator selector 308 may select a gain setting from among a continuous range of gain settings and compare the selected gain setting to one or more gain levels that may be provided by harmonics that can be generated by the first VCO 310*a* or by the second VCO 310*b*. The oscillator selector 308 is configured to select a harmonic corresponding to the selected gain setting and generate a control signal 328 based on the selected harmonic. For example, the selected harmonic may correspond to a particular frequency of a first and second LO signal 330*a*, 330*b* that, when applied to the mixers 302*a*, 302*b* along with the RF signal 320, results in a first and second output signal 322*a*, 322*b* having a selected gain. The oscillator selector 308 is further configured to provide the control signal 328 to the selection input of the multiplexer 316. The control signal 328 may determine whether the first VCO signal 355*a* or the second VCO signal 355*b* is selected by the multiplexer 316. The oscillator selector 308 is further configured to generate a frequency selection signal 329 and to provide the frequency selection signal 329 to the second VCO 310*b*. The frequency selection signal 329 may determine a frequency of the second VCO 310*b* based on the selected harmonic.

The PLL 314 is configured to provide a tuning voltage to the first VCO 310*a*. The first VCO 310*a* may be a resonant-type VCO (i.e., an inductive-capacitance (LC) VCO) operated at a multiple of the carrier frequency ($f_C$) for received signals with a low signal strength. In response to receiving the tuning voltage, the first VCO 310_a_ is configured to generate the first VCO signal 355_a_ having a first VCO frequency ($f_{VCO1}$) that is a multiple of the carrier frequency ($f_C$). For example, the first VCO frequency ($f_{VCO1}$) may be two times the carrier frequency ($f_C$) of the RF signal 320 (e.g., $f_{VCO1}=2*f_C$). The first VCO signal 355_a_ is provided to the multiplexer 316.

The second VCO 310_b_ may be a ring oscillator-type VCO that may be operated at a lower frequency for received signals with a relatively high signal strength. The second VCO 310_b_ is configured to receive the frequency selection signal 329 and to generate the second VCO signal 355_b_ having a second VCO frequency ($f_{VCO2}$) that is a fraction of the carrier frequency ($f_C$). For example, the frequency selection signal 329 may be a tuning voltage applied to the second VCO 310_b_ that may adjust the second VCO frequency ($f_{VCO2}$) based on the harmonic selected by the oscillator selector 308. The second VCO signal 355_b_ is provided to the multiplexer 316.

The multiplexer 316 is configured to receive the control signal 328, the first VCO signal 355_a_, and the second VCO signal 355_b_. The multiplexer 316 is further configured to select one of the first VCO signal 355_a_ or the second VCO signal 355_b_ to be provided to the frequency divider circuit 312 based on the control signal 328.

During operation, the oscillator selector 308 selects a harmonic corresponding to a selected gain setting based on the signal strength measurement indicator 326. For example, the oscillator selector 308 may select a first harmonic (i.e., a fundamental harmonic) if the selected gain setting is equal to 0 dB, the oscillator selector 308 may select the third harmonic if the selected gain setting is equal to −9.5 dB, the oscillator selector 308 may select the fifth harmonic if the selected gain setting is equal to −13.98 dB, and the oscillator selector 308 may select the seventh harmonic if the selected gain setting is equal to −16.90 dB. As mentioned previously, the variable gains may be a function of the LO signal duty cycle provided by divider circuit 312. The oscillator selector 308 generates the control signal 328 and the frequency selection signal 329 based on the selection and provides the control signal 328 to the multiplexer 316 and the frequency selection signal 329 to the second VCO 310_b_.

The first VCO 310_a_ generates the first VCO signal 355_a_ having a first VCO frequency ($f_{VCO1}$) substantially equal to two times the carrier frequency ($f_C$) (e.g., $f_{VCO}$=1700 MHz) in response to receiving a tuning voltage from the PLL 314. The first VCO 310_a_ provides the first VCO signal 355_a_ to the multiplexer 316. The second VCO 310_b_ generates the second VCO signal 355_b_ having a second VCO frequency ($f_{VCO2}$) equal to a fraction of the carrier frequency ($f_C$) based on the frequency selection signal 329. For example, if the selected harmonic is the third harmonic, the second VCO frequency ($f_{VCO2}$) may be substantially equal to two-thirds of the carrier frequency ($f_C$) in response to the tuning voltage associated with the frequency selection signal 329 (e.g., $f_{VCO2}$=566.67 MHz). If the selected harmonic is the fifth harmonic, the second VCO frequency ($f_{VCO2}$) may be substantially equal to two-fifths of the carrier frequency ($f_C$) in response to the tuning voltage associated with the frequency selection signal 329 (e.g., $f_{VCO2}$=340 MHz). If the selected harmonic is the seventh harmonic, the second VCO frequency ($f_{VCO2}$) may be substantially equal to two-sevenths of the carrier frequency ($f_C$) in response to the tuning voltage associated with the frequency selection signal 329 (e.g., $f_{VCO2}$=242.86 MHz).

The multiplexer 316 provides either the first VCO signal 355_a_ or the second VCO signal 355_b_ to the frequency divider circuit 312 based on the control signal 328. For example, if the first harmonic is selected, the multiplexer 316 selects the first VCO signal 355_a_ based on the control signal 328 and provides the first VCO signal 355_a_ to the frequency divider circuit 312. Alternatively, if the third, fifth, or seventh subharmonic is selected, the multiplexer 316 selects the second VCO signal 355_b_ based on the control signal 328 and provides the second VCO signal 355_b_ to the frequency divider circuit 312. The frequency divider circuit 312 can control the phase difference between first and second LO signals 330_a_ and 330_b_ so that the phase difference of the selected harmonic is ninety degrees. For example, when the $3^{rd}$ harmonic is selected the phase difference between first and second LO signals should be minus ninety degrees, in order that the phase difference between the $3^{rd}$ harmonic of LO signal 230_a_ and LO signal 230_b_ will be ninety degrees and the in-phase and quadrature baseband signals $I_{BB}$ and $Q_{BB}$ have the proper phase relationship.

It will be appreciated that the system 300 of FIG. 3 may result in power savings for strong and weak RF signals 320. For example, the system 300 may provide power savings for stronger RF signals 320 by using a lower-power VCO (e.g., the second VCO 310_b_) that is operated at a lower frequency. When the RF signal 320 is weak, the first VCO 310_a_ may provide a low-noise signal at the carrier frequency ($f_C$) (as compared to the second VCO 310_b_). When the RF signal 320 is at a suitably high level, the resonant-type VCO (i.e., the first VCO 310_a_) may be powered down and the ring oscillator VCO (i.e., the second VCO 310_b_) may be used. The ring oscillator VCO may be operated below the carrier frequency ($f_C$) and may use a selected harmonic to down-convert the RF signal 320 at the first and second mixers 302_a_, 302_b_ for power savings in VCO operation, PLL operation, and operation of the LO buffers 318_a_, 318_b_.

Figure 4:
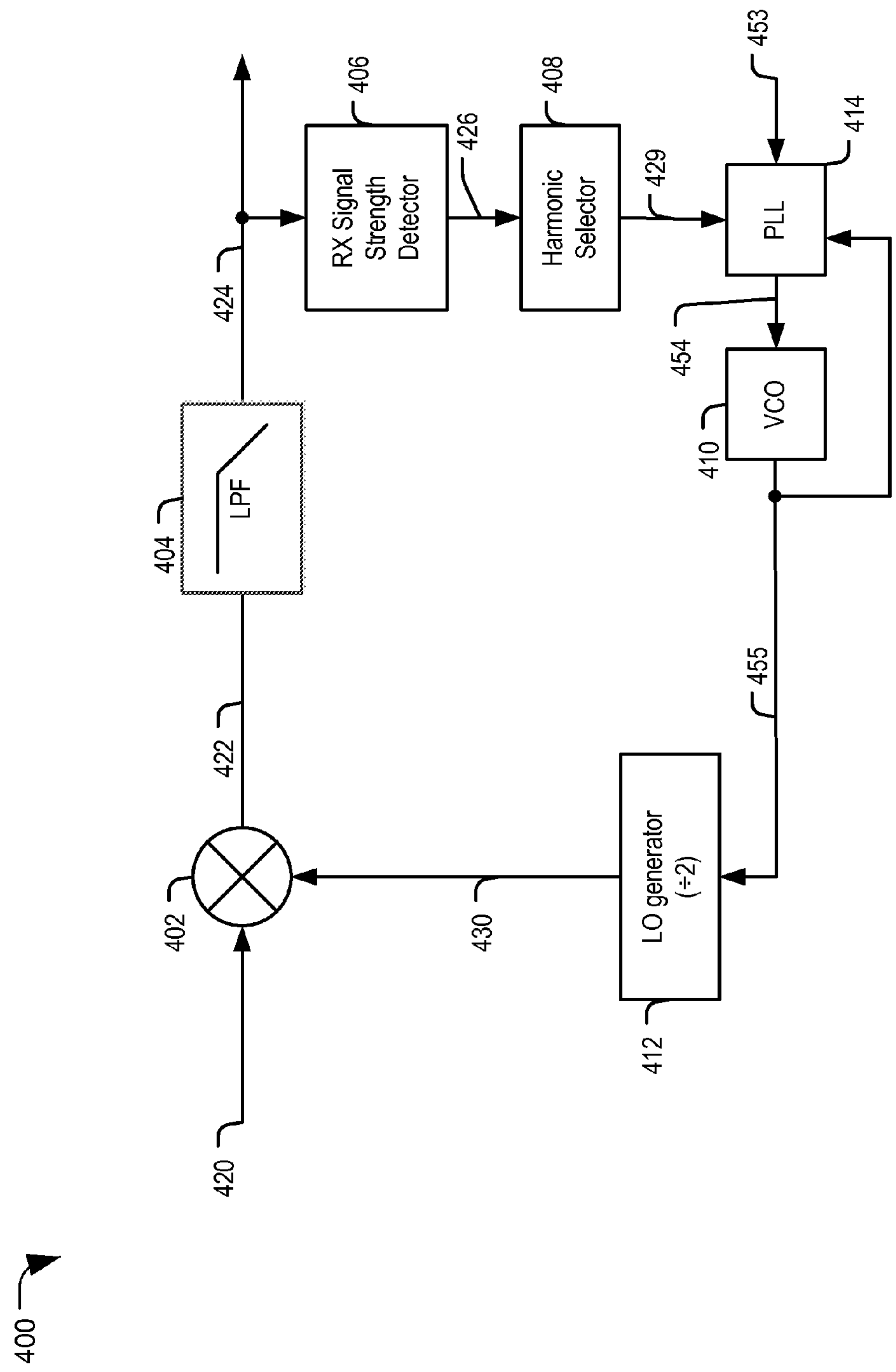
FIG. 4 is a block diagram of another particular illustrative embodiment of a system operable to select a harmonic for mixing with a received signal.

Referring to FIG. 4, another particular illustrative embodiment of a system 400 that is operable to select a harmonic for mixing with a received signal is shown. In contrast to the systems 200-300 of FIGS. 2-3, a frequency of a LO signal is adjusted by tuning a voltage controlled oscillator (VCO) 410 to operate at a selected frequency. The system 400 includes a mixer 402, a low pass filter (LPF) 404, a RX signal strength detector 406, a harmonic selector 408, the VCO 410, a local oscillator (LO) generator 412, and a phase-locked loop (PLL) 414.

The mixer 402, the LPF 404, the RX signal strength detector 406, and the harmonic selector 408 correspond to the mixers 102-302 of FIGS. 1-3, the filters 104-304 of FIGS. 1-3, the signal strength detectors 106, 306 of FIGS. 1 and 3, and the harmonic selectors 108-208 of FIGS. 1 and 2, respectively, and operate in a substantially similar manner as described with respect to the previous figures.

The mixer 402 is configured to receive a radio frequency (RF) signal 420 having a carrier frequency ($f_C$) at a first input, to receive a LO signal 430 having a LO frequency ($f_{LO}$) at a second input, and to generate an output signal 422. The LPF 404 is configured to filter the output signal 422 and to generate a baseband signal 424. The RX signal strength detector 406 is configured to detect the baseband signal 424 and to determine the signal strength of the baseband signal 424. For example, the RX signal strength detector 406 may determine whether the signal strength of the baseband signal is below or above a threshold level (i.e., whether baseband signal 424 is a weak signal or strong signal, respectively). The RX signal strength detector 406 is further configured to generate a strength indicator signal 426 based on the determination and to provide the strength indicator signal 426 to the harmonic selector 408.

The harmonic selector 408 is configured to select a harmonic corresponding to the strength of the baseband signal 424 based on the strength indicator signal 426. The harmonic selector 408 is further configured to generate a frequency selection signal 429 based on the selected harmonic and to provide the frequency selection signal 429 to the PLL 414. For example, the frequency selection signal 429 may be an input to a divider in a feedback path of the PLL 414.

The PLL 414 is configured to receive a reference signal 453 and the frequency selection signal 429. The PLL 414 is further configured to generate a tuning voltage 454 based on the frequency selection signal 429 and to provide the tuning voltage 454 to the VCO 410. The VCO 410 is configured to receive the tuning voltage 454 from the PLL 410 and to generate a VCO signal 455 having a VCO frequency ($f_{VCO}$) responsive to the tuning voltage 454. The VCO signal 455 is provided to the LO generator 412. The LO generator 412 is configured to receive the VCO signal 455 and to generate the LO signal 430 having the LO frequency ($f_{LO}$). For example, the LO generator 412 may divide the VCO frequency ($f_{VCO}$) T by two to generate an component and a 'Q' component of the LO signal 430 having the LO frequency ($f_{LO}$) (e.g., $f_{LO}=f_{VCO}/2$). The LO generator is further configured to provide the LO signal 430 to the mixer 402. Although a single mixer (i.e., mixer 402) and a single filter (i.e., LPF 404) are illustrated for clarity of explanation, separate mixers and separate low pass filters may be implemented for in-phase and quadrature paths, such as depicted in FIGS. 2 and 3.

During operation, the mixer 402 receives the RF signal 420 having a carrier frequency ($f_C$) (e.g., $f_C$=850 MHz) and receives the LO signal 430 having a LO frequency ($f_{LO}$) equal to or substantially equal to the carrier frequency ($f_C$) (e.g., $f_{LO}$=850 MHz). The RX signal strength detector 406 determines the signal strength of the baseband signal 424 and provides the strength indicator signal 426 to the harmonic selector 408. The harmonic selector 408 selects a VCO frequency ($f_{VCO}$) corresponding to the signal strength of the baseband signal 424. For example, when the baseband signal 424 corresponds to a relatively weak signal, the harmonic selector 408 may select a VCO frequency ($f_{VCO}$) equal to two times the carrier frequency ($f_C$) (e.g., $f_{VCO}$=1700 MHz). When the baseband signal 424 corresponds to a relatively strong signal, the harmonic selector 408 may select a VCO frequency ($f_{VCO}$) equal to two-thirds the carrier frequency ($f_C$) (e.g., $f_{VCO}$=566.67 MHz). The harmonic selector 408 generates the frequency selection signal 429 indicating the selected VCO frequency ($f_{VCO}$) and provides the frequency selection signal 429 to the PLL 414. The PLL 414 receives the reference signal 453 and the frequency selection signal 429 and generates the tuning voltage 454 based on the frequency selection signal 429. For example, the tuning voltage 454 may be adjustable to tune the VCO 410 to the selected frequency indicated by the frequency selection signal 429. The tuning voltage 454 is provided to the VCO 410 and the VCO 410 generates the VCO signal 455 having the selected VCO frequency ($f_{VCO}$) (e.g., $f_{VCO}$=1700 MHz when the baseband signal 424 corresponds to a weak signal and $f_{VCO}$=566.67 MHz when the baseband signal 424 corresponds to a strong signal). The VCO 410 provides the VCO signal 455 to the LO generator 412.

The LO generator 412 receives the VCO signal 455 and generates the LO signal 430 having the LO frequency ($f_{LO}$). The frequency divider circuit divides the VCO frequency ($f_{VCO}$) of the VCO signal 455 by two to generate the LO signal 430 having the LO frequency ($f_{LO}$) (e.g., $f_{LO}=f_{VCO}/2$). For example, the LO frequency ($f_{LO}$) may be equal to 850 MHz when the VCO frequency ($f_{VCO}$) is equal to 1700 MHz (e.g., $f_{LO}$=1700 MHz/2) and the LO frequency ($f_{LO}$) may be equal to 283.33 MHz when the VCO frequency ($f_{VCO}$) is equal to 567.67 MHz (e.g., $f_{LO}$=567.67 MHz/2). As explained with respect to the mixer 102 of FIG. 1, the relative conversion gain of the mixer 402 and the resulting output signal 422 may be equal to −20*logN, where N corresponds to the selected harmonic. The gain of the mixer 402 (i.e., the variable gain) may be a function of the LO signal duty cycle provided by the LO generator 412 and the selected harmonic provided by the harmonic selector 408.

It will be appreciated that the system 400 of FIG. 4 may result in power savings for strong and weak RF signals 420. For example, the VCO 410 may be operated at a multiple of the carrier frequency ($f_C$) (e.g., $f_{VCO}=2*f_C$) for relatively weak RF signals 420 and adjusted and re-locked to a lower frequency (e.g., $f_{VCO}=2f_C/3$) for relatively stronger RF signals 420. This may provide power savings for stronger signals by avoiding or reducing use of other gain reduction stages and by running the VCO 412 at a lower frequency.

Figure 5:
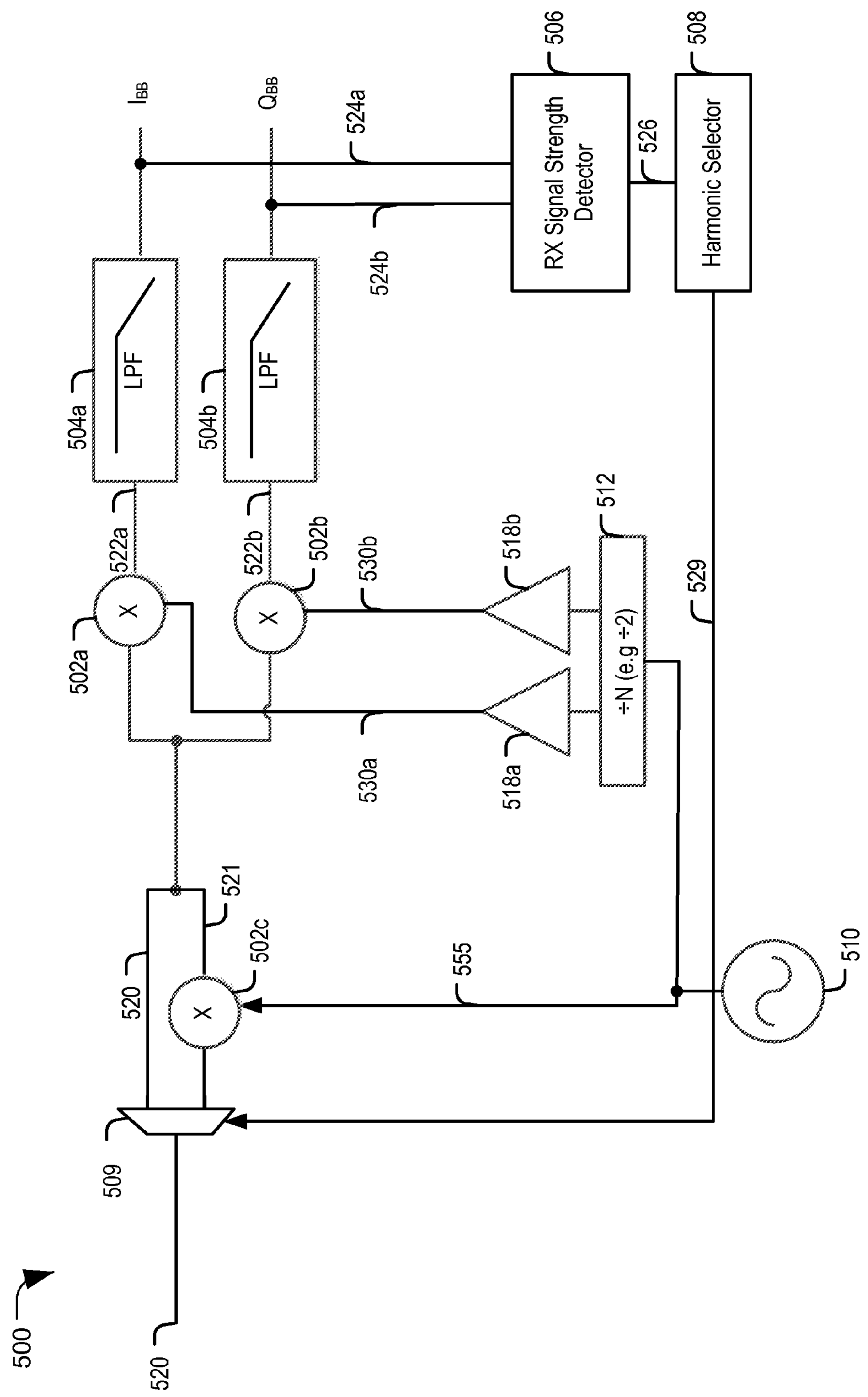
FIG. 5 is a block diagram of a particular illustrative embodiment of a sliding intermediate frequency system that includes harmonic selection to adjust a signal gain and that is operable in a wireless local area network.

Referring to FIG. 5, a particular illustrative embodiment of a sliding intermediate frequency (IF) system 500 that is operable in a wireless local area network (LAN) is shown. The system 500 may be used for a wireless local area network (LAN) having a carrier frequency ($f_C$) of 2.4 GHz. The system 500 includes a first mixer 502*a*, a second mixer 502*b*, a third mixer 502*c*, a first low pass filter (LPF) 504*a*, a second LPF 504*b*, a RX signal strength detector 506, a harmonic selector 508, a switch 509, a voltage controlled oscillator (VCO) 510, and a harmonic divider 512.

An output of the first mixer 502*a* is coupled to an input of the first LPF 504*a* and an output of the first LPF 504*a* is coupled to an input of the RX signal strength detector 506. An output of the second mixer 502*b* is coupled to an input of the second LPF 504*b* and an output of the second LPF 504*b* is coupled to an input of the RX signal strength detector 506. An output of the RX signal strength detector 506 is coupled to an input of the harmonic selector 508 and an output of the harmonic selector 508 is coupled to a selection input of the switch 509. A first output of the switch 509 is selectively coupled to a first input of the first and second mixers 502*a*, 502*b*. A second output of the switch 509 is coupled to an input of the third mixer 502*c*. An output of the VCO 510 is coupled to an input of the third mixer 502*c* and the output of the third mixer 502*c* may be selectively coupled to the first input of the first and second mixers 502*a*, 502*b*. The output of the VCO 510 is also coupled to an input of the harmonic divider 512. A first output of the harmonic divider 512 is coupled to an input of a first LO buffer 518*a* and an output of the first LO buffer 518*a* is coupled to a second input of the first mixer 502*a*. A second output of the harmonic divider 512 is coupled to an input of a second LO buffer 518*b* and an output of the second LO buffer 518*b* is coupled to a second input of the second mixer 502*b*.

The switch 509 is configured to receive an RF signal 520 and selectively provide the RF signal 520 to the third mixer 502*c* or to selectively provide the RF signal 520 to the first and second mixers 502*a*, 502*b* (i.e., selectively bypassing the third mixer 502*c*). For example, the switch 509 is configured to be responsive to a selection signal 529 from the harmonic selector 508 that indicates whether the system 500 should operate in a sliding intermediate frequency (IF) dual conversion mode or in a sub-harmonic conversion mode. When operating in the sliding IF dual conversion mode, the switch 509 is configured to provide the RF signal 520 to the third mixer 502*c*. When operating in the sub-harmonic mode, the switch 509 is configured to selectively bypass the third mixer 502*c* and to provide the RF signal 520 directly to the first and second mixers 502*a*, 502*b*. In the sliding IF dual conversion mode, the third mixer 502*c* is configured to receive the RF signal 520 and a VCO signal 555 and to generate an output signal 521 having an intermediate frequency (e.g., a non-baseband signal).

The first mixer 502*a* is configured to receive either the RF signal 520 or the output signal 521 at a first input and a first LO signal 530*a* having a LO frequency ($f_{LO}$) at a second input. The first mixer 502*a* is further configured to mix the RF signal 520 (or the output signal 521) with the first LO signal 530*a* to generate a first output signal 522*a*. The frequency of the first LO signal 530*a* may affect a conversion gain of the first mixer 502*a* and a resulting signal strength the first output signal 522*a*. The first output signal 522*a* may be an in-phase component of an intermediate frequency (IF) signal or an in-phase component of a baseband signal. The first LO signal 530*a* may be an in-phase component of a LO signal. The first mixer 302*a* is further configured to provide the first output signal 522*a* to an input of the first LPF 504*a*. The second mixer 502*b* is configured to operate in a similar manner as the first mixer 502*a* and to generate a second output signal 522*b*. The second output signal 522*b* may be a quadrature component of an intermediate frequency (IF) signal or a quadrature component of a baseband signal, and a second LO signal 530*b* provided to the second mixer 502*b* may be a quadrature component of a LO signal.

The first LPF 504*a* is configured to receive the first output signal 522*a* and to filter the first output signal 522*a* to generate a first baseband signal 524*a* (i.e., an in-phase component of the filtered output signal 124 of FIG. 1 ($I_{BB}$)) that is provided to an input of the RX signal strength detector 506. The second LPF 504*b* is configured to receive the second output signal 522*b* and to filter the second output signal 522*b* to generate a second baseband signal 524*b* (i.e., a quadrature component of the filtered output signal 124 of FIG. 1 ($Q_{BB}$)) that is provided to an input of the RX signal strength detector 506.

The RX signal strength detector 506 is configured to detect the first baseband signal 524*a*, the second baseband signal 524*b*, or any combination thereof, and determine the signal strength of at least one of the detected signals 524*a*, 524*b*. For example, the RX signal strength detector 506 may determine whether the signal strength of the baseband signals 524*a*, 524*b* is below or above a threshold level (i.e., whether the baseband signals 524*a*, 524*b* are weak or strong signals, respectively). The RX signal strength detector 506 is further configured to generate a strength indicator signal 526 based on the determination and to provide the strength indicator signal 526 to the harmonic selector 508.

The harmonic selector 508 is configured to receive the strength indication signal 526 and to determine whether the system 500 should operate in a sliding IF dual conversion mode or in a sub-harmonic conversion mode based on the strength indicator signal 526. For example, when the signal strength of the detected signals 524*a*, 524*b* is above the threshold level (i.e., the detected signals 524*a*, 524*b* correspond to strong signals), the harmonic selector 508 may determine that the system 500 should operate in the sub-harmonic conversion mode. When the signal strength of the detected signal 524*a*, 524*b* is below the threshold level (i.e., the detected signal 524*a*, 524*b* correspond to weak signals), the harmonic selector 508 may determine that the system 500 should operate in the sliding IF dual conversion mode. As explained above, the harmonic selector 508 is configured to provide the selection signal 529 indicating the operating mode to the switch 509.

The VCO 510 is configured to generate the VCO signal 555 and to provide the VCO signal 555 to the third mixer 502*c* and to the harmonic divider 512. The harmonic divider 512 is configured to divide a VCO frequency ($f_{VCO}$) of the VCO signal 555 to generate the first and second LO signals 530*a*, 530*b* having a LO frequency ($f_{LO}$) that is equal to a fraction of the VCO frequency ($f_{VCO}$). The first LO signal 530*a* is provided to the second input of the first mixer 502*a* via a first LO buffer 518*a* and the second LO signal 530*b* is provided to the second input of the second mixer 502*b* via a second LO buffer 518*b*.

During operation, the switch 509 receives the RF signal 520 having a carrier frequency ($f_C$). For example, the carrier frequency ($f_C$) of the RF signal 520 may be equal to 2.4 GHz. The switch 509 may bypass the third mixer 502*c* and provide the RF signal 520 to the first mixer 502*a* and to the second mixer 502*b*.

The VCO 510 generates the VCO signal 555 having a VCO frequency ($f_{VCO}$) that is equal to or substantially equal to two-thirds the carrier frequency ($f_C$) (e.g., $f_{VCO}$=1.6 GHz) and provides the VCO signal 555 to the harmonic divider 512. In the particular illustrative embodiment, the harmonic divider 512 divides the VCO frequency ($f_{VCO}$) by two to generate the first and second LO signals 530*a*, 530*b* having a LO frequency ($f_{LO}$) equal to 800 MHz (e.g., $f_{LO}$=1.6 GHz/2). As explained above with respect to the frequency divider circuit 212 of FIG. 2, the harmonic divider 512 can control the phase difference between the first and second LO signals 530*a*, 530*b* so that the phase difference of the selected harmonic is approximately ninety degrees. In another particular embodiment, the harmonic divider 512 may divide VCO frequency ($f_{VCO}$) by four or six to generate first and second LO signals 530*a*, 530*b* having a LO frequency ($f_{LO}$) equal to 400 MHz and 266.67 MHz, respectively.

The first mixer 502*a* receives the RF signal 520 and also receives the first LO signal 530*a* having the LO frequency ($f_{LO}$) equal to or substantially equal to half the VCO frequency ($f_{VCO}$) (e.g., $f_{LO}$=800 MHz, having a third harmonic at the carrier frequency ($f_C$)). The second mixer 502*b* receives the RF signal 520 and also receives the second LO signal 530*b* having the LO frequency ($f_{LO}$) equal to or substantially equal to half the VCO frequency ($f_{VCO}$) (e.g., $f_{LO}$=800 MHz). The first mixer 502*a* mixes the RF signal 520 with the first LO signal 530*a* to generate the first output signal 522*a* and provides the first output signal 522*a* to the first LPF 504*a*. The second mixer 502*b* mixes the RF signal 520 with the second LO signal 530*b* to generate the second output signal 522*b* and provides the second output signal 522*b* to the second LPF 504*b*. The mixing operations of the first and second mixers 502*a*, 502*b* may correspond to a second stage of down-conversion. The mixing operation of the third mixer 502*c* may correspond to a first stage of down-conversion. The first LPF 504*a* filters the first output signal 522*a* to generate the first baseband signal 524*a* and the second LPF 522*b* filters the second output signal 522*b* to generate the second baseband signal 524*b*.

The first LPF 504*a* provides the first baseband signal 524*a* to the RX signal strength detector 506 and the second LPF 504*a* provides the second baseband signal 524*b* to the RX signal strength detector 506. The RX signal strength detector 506 determines whether the signal strength of the baseband signals 524*a*, 524*b* is below or above the threshold level and generates the strength indicator signal 526 based on the determination. The harmonic selector 508 receives the strength indicator signal 526, determines an operating mode for the system 500 based on the strength indicator signal 526, and generates the selection signal 529 indicating the operating mode.

When the signal strength of the baseband signals 524*a*, 524*b* is below the threshold level (i.e., the baseband signals 524*a*, 524*b* correspond to weak signals), the harmonic selector 508 determines that the system 500 should operate in the sliding IF dual conversion mode and provides the selection signal 529 indicating the determination to the switch 509. In response to receiving the selection signal 529, the switch 509 selectively provides the RF signal 520 having the carrier frequency ($f_C$) of 2.4 GHz to the third mixer 502*c*. The VCO 510 provides the VCO signal 555 having a VCO frequency ($f_{VCO}$) that is equal to or substantially equal to two-thirds the carrier frequency ($f_C$) (e.g., $f_{VCO}$=1.6 GHz) to the third mixer 502*c* and the third mixer 502*c* mixes the RF signal 520 with the VCO signal 555 to generate the output signal 521 having an intermediate frequency ($f_{IF}$) of 800 MHz (i.e., the first stage of down-conversion). The first mixer 502*a* receives the output signal 521 and also receives the first LO signal 530*a* having the LO frequency ($f_{LO}$) equal to or substantially equal to half the VCO frequency ($f_{VCO}$) (e.g., $f_{LO}$=800 MHz). The second mixer 502*b* receives the output signal 521 and also receives the second LO signal 530*b* having the LO frequency ($f_{LO}$) equal to or substantially equal to half the VCO frequency ($f_{VCO}$) (e.g., $f_{LO}$=800 MHz). The first and second mixers 502*a*, 502*b* mix the output signal 521 with the first and second LO signals 530*a*, 530*b*, respectively, to generate output signals 522*a*, 522*b* with a down-converted frequency (i.e., the second stage of down-conversion).

When the signal strength of the baseband signal 524*a*, 524*b* is above the threshold level (i.e., the baseband signal 524*a*, 524*b* correspond to strong signals), the harmonic selector 508 determines that the system 500 should operate in the subharmonic conversion mode and provides the selection signal 529 indicating the determination to the switch 509. In response to receiving the selection signal 529, the switch 509 continues to provide the RF signal 520 directly to the first and second mixers 502*a*, 502*b* (i.e., bypassing the first stage of down-conversion and performing the second stage of down-conversion). When subharmonic conversion mode is selected, if the subharmonic is the $3^{rd}$ or $7^{th}$ subharmonic, for example, the harmonic divider 512 can adjust the relative phase of the LO signals 530*a* and 530*b* so that the proper phase relationship is maintained between baseband outputs $I_{BB}$ and $Q_{BB}$. Alternatively, in the $3^{rd}$ and $7^{th}$ subharmonic conversion modes, the phase of the $Q_{BB}$ signal can be inverted relative to the sliding IF and $5^{th}$ subharmonic conversion modes to maintain the correct phase relationship between $I_{BB}$ and $Q_{BB}$. The phase of the $Q_{BB}$ signal can be inverted either in the low pass filter 504*b*, or further downstream in the circuits that receive the $I_{BB}$ and $Q_{BB}$ signal and which are not shown in this FIG. 5.

It will be appreciated that the system 500 of FIG. 5 may reduce power consumption by reducing or avoiding gain reduction provided by a separate gain reduction stage for weak signals. For example, the system 500 enables a sliding IF dual conversion mode where the received RF signal 520 is mixed by the VCO signal 555 and the result (i.e., the output single 521) is mixed again by the LO signal 530*a*, 530*b* at a fraction (e.g., ½) of the VCO frequency ($f_{VCO}$) of the VCO signal 555. In addition, power consumption may be reduced by bypassing the first stage of down-conversion when the received RF signal 520 corresponds to a strong signal.

Figure 6:
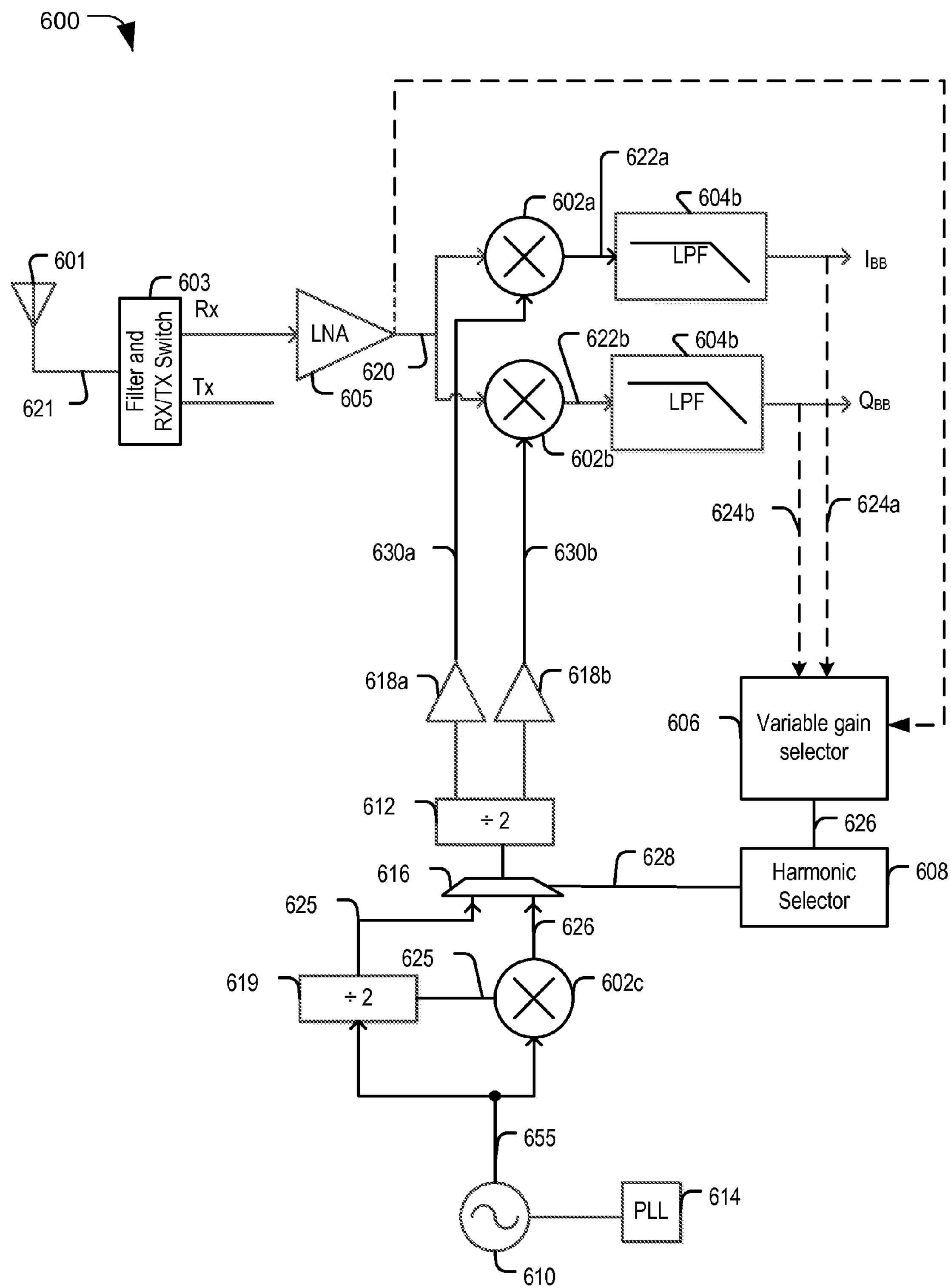
FIG. 6 is a block diagram of a particular illustrative embodiment of a system that includes harmonic selection to adjust a signal gain and that is operable in a wireless local area network.

Referring to FIG. 6, a particular illustrative embodiment of a system 600 including a local oscillator operable in a wireless local area network is shown. The system 600 may be used for a wireless local area network (LAN) having a carrier frequency ($f_C$) of 2.4 GHz. The system 600 includes an antenna 601, a front end module 603 that may contain an RF filter and a receive transmit switch, a low noise amplifier (LNA) 605, a first mixer 602*a*, a second mixer 602*b*, a third mixer 602*c*, a first low pass filter (LPF) 604*a*, a second LPF 604*b*, a variable gain selector 606, a harmonic selector 608, a first divider circuit 612, a second divider circuit 619, a voltage controlled oscillator (VCO) 610, a switch 616, and a phase locked loop (PLL) 614. Although the filter and switch 603 is illustrated, the filter 603 may be omitted in a Wireless LAN implementation according to a half-duplex protocol.

The antenna 601, the filter and switch 603, the LNA 605, the variable gain selector 606, and the harmonic selector 608 correspond to the antenna 201, the duplexer 203, the LNA 205, the variable gain selector 206, and the harmonic selector 208 respectively, of FIG. 2 and operate in a substantially similar manner as described with respect to the corresponding components of FIG. 2. The first mixer 602*a*, the second mixer 602*b*, the first LPF 604*a*, and the second LPF 604*b* correspond to the first mixer 502*a*, the second mixer 502*b*, the first LPF 504*a*, and the second LPF 504*b*, respectively, of FIG. 5 and operate in a substantially similar manner as described with respect to the corresponding components of FIG. 5.

The harmonic selector 608 is configured to select a harmonic corresponding to a gain setting selected by the variable gain selector 606 and to generate a control signal 628 based on the selected harmonic. For example, the selected harmonic may correspond to a particular frequency of a first and second LO signal 630*a*, 630*b* that, when applied to the first and second mixers 602*a*, 602*b*, respectively, along with an RF signal 620, results in a first and second output signal 622*a*, 622*b* having a selected gain. The harmonic selector 608 is further configured to provide the control signal 628 to a selection input of the switch 616.

The PLL 614 is configured to provide a tuning voltage to the VCO 610. In response to receiving the tuning voltage, the VCO 610 is configured to generate a VCO signal 655 having a VCO frequency ($f_{VCO}$). For example, the VCO frequency ($f_{VCO}$) may be equal to four-thirds of the carrier frequency ($f_C$) of a radio-frequency (RF) signal 620 (e.g., $f_{VCO}$=4/3*$f_C$). The VCO 610 is further configured to provide the VCO signal 655 to the second divider circuit 619 and to the third mixer 602*c*.

The second divider circuit 619 is configured to divide the VCO frequency ($f_{VCO}$) by two and to generate a first signal 625 having a frequency equal to half the VCO frequency ($f_{VCO}$) (e.g., ½*$f_{VCO}$=2/3*$f_C$). The second divider circuit 619 is further configured to provide the first signal 625 to the third mixer 602*c* and to a first input of the switch 619. The third mixer 602*c* is configured to mix the first signal 625 and the VCO signal 655 and generate a second signal 626 having a frequency equal to two times the carrier frequency ($f_C$) (e.g., 4/3*$f_C$ (from the VCO 610)+2/3*$f_C$ (from the second divider circuit 619)=2*$f_C$). The third mixer 602 is further configured to provide the second signal 626 to a second input of the switch 616.

In an alternate embodiment, the second divider circuit 619 may be configured to divide the VCO frequency ($f_{VCO}$) by n, where n is equal to an even integer. The second signal 626 may have a frequency equal to ($f_{VCO}$*(n−1)/n) or equal to ($f_{VCO}$*(n+1)/n). For example, in an embodiment where the carrier frequency ($f_C$) is approximately 2100 MHz, n is 4, and the VCO frequency ($f_{VCO}$) is approximately 5600 MHz, the first signal 625 may have a frequency of approximately 1400 MHz (i.e., $f_{VCO}$/4) and the second signal 626 may have a frequency of approximately 4200 MHz (i.e., $f_{VCO}$*(n−1)/n).

In another embodiment where the carrier frequency ($f_C$) is approximately 3500 MHz, n is 4, and the VCO frequency ($f_{VCO}$) is approximately 5600 MHz, the first signal 625 may have a frequency of approximately 1400 MHz (i.e. $f_{VCO}/4$) and the second signal 626 may have a frequency of approximately 7000 MHz (i.e., $f_{VCO}*(n+1)/n$).

The switch 616 is configured to provide the first signal 625 or the second signal 626 to the first divider circuit 616 based on the received control signal 628 from the harmonic selector 616. For example, when the control signal 628 indicates a fundamental mode of operation, the switch 616 may provide the second signal 626 to the first divider circuit 616. Alternatively, when the control signal 628 indicates a sub-harmonic mode of operation, the switch 616 may provide the first signal 625 to the first divider circuit 616. When the first signal 625 is provided to the first divider circuit 616, the relative conversion gain of at the first and second mixers 602*a*, 602*b* may be equal to −20 logN, where N corresponds to the selected harmonic. The first divider circuit 612 is configured to receive the output of the switch 616 and to generate the first LO signal 630*a* having the LO frequency ($f_{LO}$) and the second LO signal 630*b* having the LO frequency ($f_{LO}$). The first divider circuit 612 is configured to provide the first LO signal 630*a* to the second input of the first mixer 602*a* via the first LO buffer 618*a* and the second LO signal 630*b* to the second input of the second mixer 602*b* via the second LO buffer 618*b*.

During operation, an initialization process is performed and the antenna 601 receives an incoming signal 621 having a carrier frequency ($f_C$) (e.g., $f_C$=2400 MHz) and provides the incoming signal 621 to the LNA 605 through the reception path (Rx) of the filter and switch 603. The LNA 605 generates the RF signal 620 and provides the RF signal 620 to the first and second mixers 602*a*, 602*b*. The first mixer 602*a* receives the RF signal 620 and also receives the first LO signal 630*a* having a LO frequency ($f_{LO}$) equal to or substantially equal to the carrier frequency ($f_C$) (e.g., $f_{LO}$=2400 MHz). The second mixer 602*b* receives the RF signal 620 and also receives the second LO signal 630*b* having a LO frequency ($f_{LO}$) equal to or substantially equal to the carrier frequency ($f_C$) (e.g., $f_{LO}$=2400 MHz). The first mixer 602*a* mixes the RF signal 620 with the first LO signal 630*a* to generate the first output signal 622*a* and provides the first output signal 622*a* to the first LPF 604*a*. The second mixer 602*b* mixes the RF signal 620 with the second LO signal 630*b* to generate the second output signal 622*b* and provides the second output signal 622*b* to the second LPF 604*b*. The first LPF 604*a* filters the first output signal 622*a* to generate a first baseband signal 624*a* and the second LPF 622*b* filters the second output signal 622*b* to generate a second baseband signal 624*b*.

In a particular embodiment, the first LPF 604*a* provides the first baseband signal 624*a* to the variable gain selector 606 and the second LPF 604*a* provides the second baseband signal 624*b* to the variable gain selector 606. The variable gain selector 606 determines the signal strength of the baseband signals 624*a*, 624*b*. In another particular embodiment, the LNA 605 provides the RF signal 620 to the variable gain selector 606. The variable gain selector determines the signal strength of the RF signal 620. The variable gain selector 606 selects a gain setting, generates a gain selection signal 626 based on the selection, and provides the gain selection signal 626 to the harmonic selector 608.

The harmonic selector 608 selects a harmonic corresponding to the selected gain setting and generates the control signal 628 based on the selected harmonic. For example, the harmonic selector 608 may select the third harmonic if the selected gain setting is equal to −9.5 dB or the harmonic selector 608 may select the fundamental harmonic (i.e., the first harmonic) if the selected gain setting is equal to 0 dB. The VCO 610 generates the VCO signal having a VCO frequency ($f_{VCO}$) equal to four-thirds the carrier frequency ($f_C$) (e.g., $f_{VCO}$=3200 MHz) in response to receiving the tuning voltage from the PLL 614. The VCO 610 provides the VCO signal 655 to the second divider circuit 619 and to the third mixer 602*c*. The second divider circuit 619 divides the VCO frequency ($f_{VCO}$) by two and generates the first signal 625 having a frequency substantially equal to 1600 MHz and provides the first signal 625 to the first input of the switch 616 and to the third mixer 602*c*. The third mixer 602*c* mixes the first signal 625 with the VCO signal 655 and generates the second signal 626 having a frequency substantially equal to 4800 MHz. The third mixer 602*c* provides the second signal 626 to the second input of the switch 616.

The switch 616 provides the first signal 625 to the first divider circuit 612 when the control signal 628 corresponds to the third harmonic and the switch 616 provides the second signal 626 to the first divider circuit 612 when the control signal 628 corresponds to the fundamental harmonic. When the first divider circuit 612 receives the first signal 625, the first divider circuit 612 divides the frequency of the first signal 625 by two to generate the first and second LO signals 630*a*, 630*b* having the LO frequency ($f_{LO}$) (e.g., $f_{LO}$=800 MHz). Thus, the LO frequency ($f_{LO}$) may correspond to the third harmonic (e.g., $f_{LO}$=1/3*2400 MHz) and the first and second LO signals 630*a*, 630*b* may be intermediate frequency signals having a third harmonic at the carrier frequency ($f_C$). When the first divider circuit 612 receives the second signal 626, the first divider circuit 612 divides the frequency of the second signal 626 by two to generate the first and second LO signals 630*a*, 630*b* having the LO frequency ($f_{LO}$) (e.g., $f_{LO}$=2400 MHz). Thus, the LO frequency ($f_{LO}$) may correspond to the fundamental harmonic (e.g., $f_{LO}=f_C$). As explained above with respect to the frequency divider circuit 212 of FIG. 2, the first divider circuit 612 can control the phase difference between the first and second LO signals 630*a*, 630*b* so that the phase difference of the selected harmonic is approximately ninety degrees.

It will be appreciated that the system 600 of FIG. 6 may reduce power consumption by reducing an amount of gain reduction provided by a gain reduction stage for strong signals. Power consumption may also be reduced as compared to the system 300 of FIG. 3 due to reduced complexity and reduction of power consumption by avoiding use of dual VCOs. Additionally, power consumption may be reduced by operating the divider circuit 612 and the buffer circuits 618*a* and 618*b* at a lower frequency relative to the carrier frequency ($f_C$).

Figure 7:
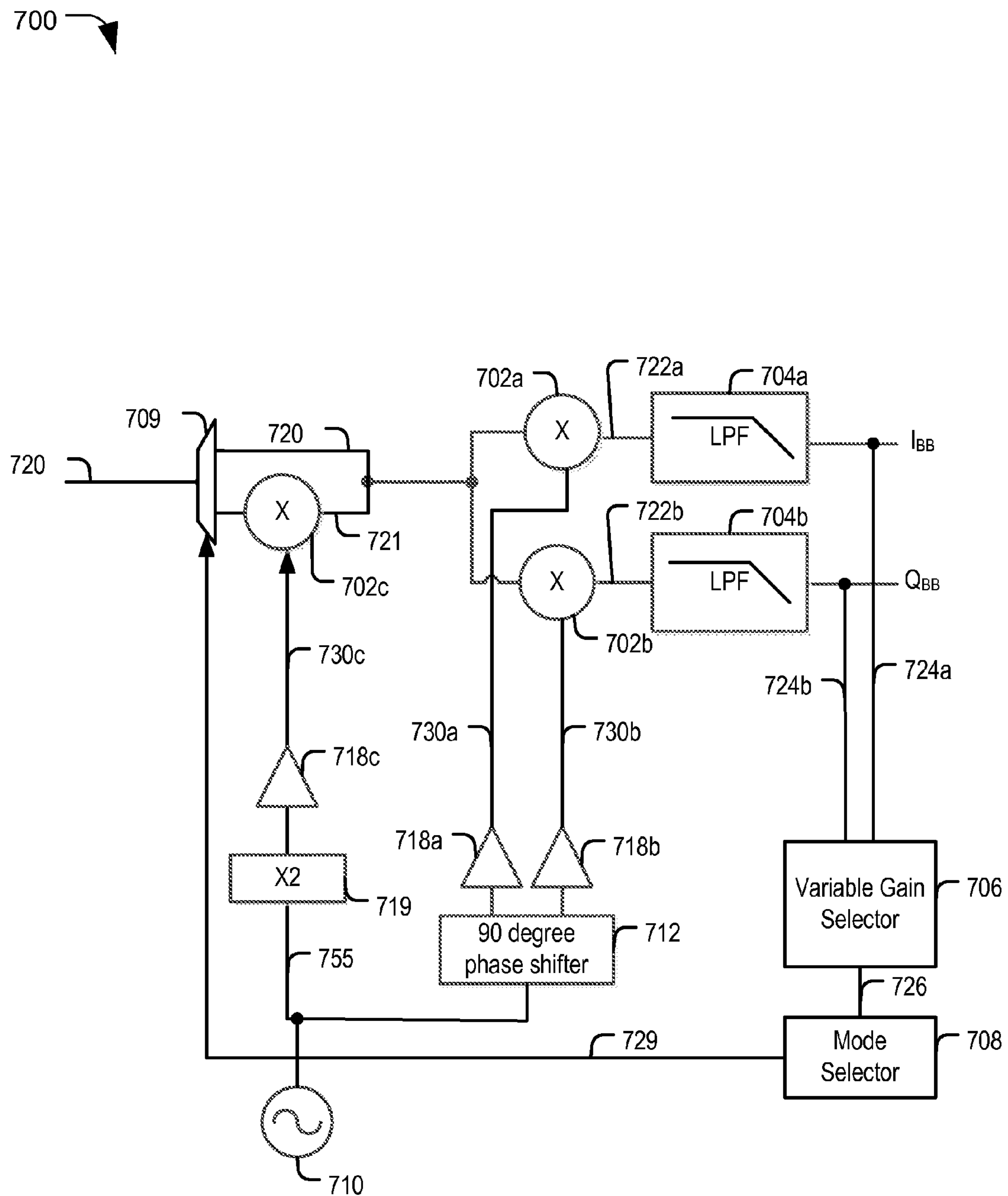
FIG. 7 is a block diagram of a particular illustrative embodiment of a sliding intermediate frequency system that includes harmonic selection to adjust a signal gain and that is operable in 60 GHz wireless gigabit receivers and 60 GHz wireless high-definition receivers.

Referring to FIG. 7, a particular illustrative embodiment of a sliding intermediate frequency system 700 operable in 60 GHz wireless receivers (e.g., a 60 GHz Wireless Gigabit receiver or a 60 GHz wireless high-definition receiver) is shown. The system 700 includes a first mixer 702*a*, a second mixer 702*b*, a third mixer 702*c*, a first low pass filter (LPF) 704*a*, a second LPF 704*b*, a variable gain selector 706, a mode selector 708, a switch 709, a voltage controlled oscillator (VCO) 710, a phase shifter 712, and a multiplier circuit 719.

The first mixer 702*a*, the second mixer 702*b*, the third mixer 702*c*, the first LPF 704*a*, and the second LPF 704*b* correspond to the first mixer 502*a*, the second mixer 502*b*, the third mixer 502*c*, the first LPF 504*b*, and the second LPF 504*b*, respectively, of FIG. 5 and operate in a substantially similar manner as the corresponding components as described with respect to FIG. 5.

The variable gain selector 706 is configured to detect a first and second baseband signal 724*a*, 724*b* and to determine the signal strength of the baseband signals 724*a*, 724*b*. The variable gain selector 706 is further configured to select a variable gain setting based on the signal strength of the baseband signals 724*a*, 724*b*, to generate a gain selection signal 726 based on the selection, and to provide the gain selection signal 726 to the mode selector 708.

The mode selector 708 is configured to select a mode for the system 700 to operate based on the gain selection signal 726. For example, the mode selector 708 is configured to select whether the system 700 should operate in a sliding IF dual conversion mode or a sub-harmonic conversion mode based on the gain selection signal 726 and to generate a control signal 729 indicating the selected mode. The mode selector 708 is further configured to provide the control signal 729 to a selection input of the switch 709.

The VCO 710 is configured to generate a VCO signal 755 and to provide the VCO signal 755 to the multiplier circuit 719 and to the phase shifter 712. The multiplier circuit 719 is configured to multiply a VCO frequency ($f_{VCO}$) of the VCO signal 755 by two to generate a third LO signal 730*c* having a frequency ($f_{LO3}$) equal to twice the VCO frequency ($f_{VCO}$). The third LO signal 730*c* is provided to the third mixer 702*c* via the third LO buffer 718*c*.

The phase shifter 712 is configured to generate a first LO signal 730*a* having approximately a zero degree phase shift from the VCO signal 755 and to generate a second LO signal 730*b* having approximately a ninety degree phase shift from the VCO signal 755. The first and second LO signals 730*a*, 730*b* have a LO frequency ($f_{LO}$) that is substantially equal to the VCO frequency ($f_{VCO}$). The first LO signal 730*a* is provided to the second input of the first mixer 702*a* via a first LO buffer 718*a* and the second LO signal 730*b* is provided to the second input of the second mixer 702*b* via a second LO buffer 718*b*.

During operation, an initialization process is performed and the switch 709 receives a radio-frequency (RF) signal 720 having a carrier frequency ($f_C$). For example, the carrier frequency ($f_C$) of the RF signal 720 may be equal to 60 GHz. In a sub-harmonic conversion mode, the switch 709 may provide the RF signal 720 to the first mixer 702*a* and to the second mixer 702*b*, bypassing the third mixer 702*c*.

The VCO 710 generates the VCO signal 755 having a VCO frequency ($f_{VCO}$) that is equal to or substantially equal to one-third the carrier frequency ($f_C$) (e.g., $f_{VCO}$=20 GHz) and provides the VCO signal 755 to the phase shifter 712. In the particular illustrative embodiment, the phase shifter 712 generates the first LO signal 730*a* having a LO frequency ($f_{LO}$) approximately equal to 20 GHz and having a phase approximately matching the phase of the VCO signal 755. The phase shifter 712 also shifts the phase of the VCO signal 755 by approximately ninety degrees to generate the second LO signal 730*b* having a LO frequency ($f_{LO}$) approximately equal to 20 GHz. The first mixer 702*a* receives the RF signal 720 and also receives the first LO signal 730*a* having the LO frequency ($f_{LO}$) equal to or substantially equal to the VCO frequency ($f_{VCO}$) (e.g., $f_{LO}$=20 GHz). The second mixer 702*b* receives the RF signal 720 and also receives the second LO signal 730*b* having the LO frequency ($f_{LO}$) equal to or substantially equal to the VCO frequency ($f_{VCO}$) (e.g., $f_{LO}$=20 GHz). The first mixer 702*a* mixes the RF signal 720 (e.g., at 60 GHz) with the first LO signal 730*a* (e.g., at 20 GHz with a third harmonic at 60 GHz) to generate a first output signal 722*a* with a relative conversion gain of −9.5 dB and provides the first output signal 722*a* to the first LPF 704*a*. The second mixer 702*b* mixes the RF signal 720 with the second LO signal 730*b* (e.g., at 20 GHz with a third harmonic at 60 GHz) to generate a second output signal 722*b* with a relative conversion gain of −9.5 dB and provides the second output signal 722*b* to the second LPF 704*b*. The first LPF 704*a* filters the first output signal 722*a* to generate the first baseband signal 724*a* and the second LPF 704*b* filters the second output signal 722*b* to generate the second baseband signal 724*b*.

The first LPF 704*a* provides the first baseband signal 724*a* to the variable gain selector 706 and the second LPF 704*a* provides the second baseband signal 724*b* to the variable gain selector 706. The variable gain selector 706 measures the signal strength of the baseband signals 724*a*, 724*b* and selects a gain setting based on the signal strength. For example, the variable gain selector 706 may select a 0 dB gain setting or a −9.5 dB gain setting. The variable gain selector 706 generates the gain selection signal 726 indicating the selected gain and provides the gain selection signal 726 to the mode selector 708.

The mode selector 708 selects a mode for the system 700 to operate based on the gain selection signal 726. For example, the mode selector 708 may select for the system 700 to operate in the sliding IF dual conversion mode by providing a control signal 729 that indicates the sliding IF dual conversion mode to the switch 709 when the gain selection signal 726 corresponds to a 0 dB gain setting. In response to receiving the control signal 729, the switch 709 selectively provides the RF signal 720 having the carrier frequency ($f_C$) of 60 GHz to the third mixer 702*c*. The VCO 710 provides the VCO signal 755 having a VCO frequency ($f_{VCO}$) that is equal to or substantially equal to one-third the carrier frequency ($f_C$) (e.g., $f_{VCO}$=20 GHz) to the multiplier circuit 719. The multiplier circuit 719 multiplies the VCO frequency ($f_{VCO}$) by two to generate the third LO signal 730*c* having a frequency ($f_{LO3}$) approximately equal to 40 GHz. The third LO signal 730*c* is provided to the third mixer 702*c* and the third mixer 702*c* mixes the RF signal 720 with the third LO signal 730*c* to generate an output signal 721 having an intermediate frequency ($f_{IF}$) of approximately 20 GHz (i.e., a first down-conversion stage). The first mixer 702*a* receives the output signal 721 and also receives the first LO signal 730*a* having the LO frequency ($f_{LO}$) equal to or substantially equal to the VCO frequency ($f_{VCO}$) (e.g., $f_{LO}$=20 GHz). The second mixer 702*b* receives the output signal 721 and also receives the second LO signal 730*b* having the LO frequency ($f_{LO}$) equal to or substantially equal to the VCO frequency ($f_{VCO}$) (e.g., $f_{LO}$=20 GHz). The first and second mixers 702*a*, 702*b* mix the output signal 721 with the first and second LO signals 730*a*, 730*b*, respectively, to generate output signals 722*a*, 722*b* with a down-converted frequency (i.e., a second down-conversion stage).

It will appreciated that the system 700 of FIG. 7 may select the sub-harmonic conversion mode and reduce power consumption by bypassing the first down-conversion stage.

Figure 8:
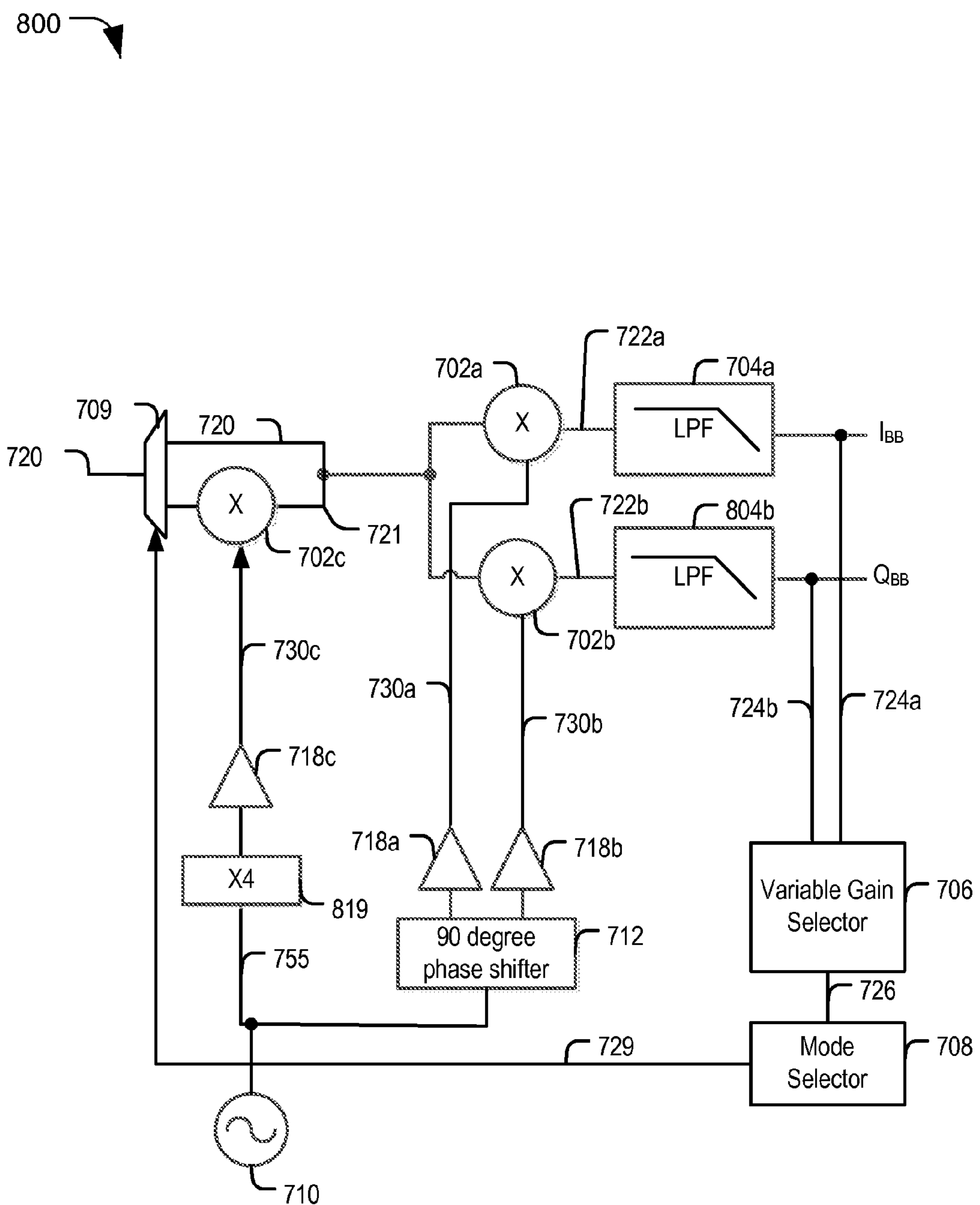
FIG. 8 is a block diagram of another particular illustrative embodiment of a sliding intermediate frequency system that includes harmonic selection to adjust a signal gain and that is operable in 60 GHz wireless gigabit receivers and 60 GHz wireless high-definition receivers.

Referring to FIG. 8, a particular illustrative embodiment of a sliding intermediate frequency (IF) system 800 operable in 60 GHz wireless receivers (e.g., a 60 GHz Wireless Gigabit receiver or a 60 GHz wireless high-definition receiver) is shown. In contrast to the multiplier circuit 719 of FIG. 7, a multiplier circuit 819 of FIG. 8 is configured to multiply a VCO frequency ($f_{VCO}$) by four.

In the illustrative embodiment of FIG. 8, the VCO 710 generates a VCO signal 755 having a VCO frequency ($f_{VCO}$) approximately equal to one-fifth the carrier frequency ($f_C$) (e.g., $f_{VCO}$=12 GHz) and the multiplier circuit 819 generates a third LO signal 730*c* having a frequency approximately equal to 48 GHz. The phase shifter 712 generates a first and second LO signal 730*a*, 730*b* having an LO frequency ($f_{LO}$) approximately equal to the VCO frequency ($f_{VCO}$) (e.g., $f_{LO}$=12 GHz). The phase of the first LO signal 730*a* may be approximately the same as the phase of the VCO signal 755 and the phase of the second LO signal 730*b* may be shifted approximately 90 degrees. Thus, when the system 800 operates in a sliding IF dual conversion mode, the RF signal 720 is mixed by the third LO signal 730*c* (e.g., four times the VCO frequency ($f_{VCO}$)) and then mixed by the first and second LO signals 730*a*, 730*b* (e.g., the VCO frequency ($f_{VCO}$)) at the first and second mixers 702*a*, 702*b*, respectively. When the system 800 operates in a sub-harmonic conversion mode, the RF signal 720 is mixed at the first and second mixers 702*a*, 702*b* with the first and second LO signals 730*a*, 730*b*, respectively, and the relative conversion gain of the mixer is approximately −20 log 5, or −13.98 dB.

Figure 9:
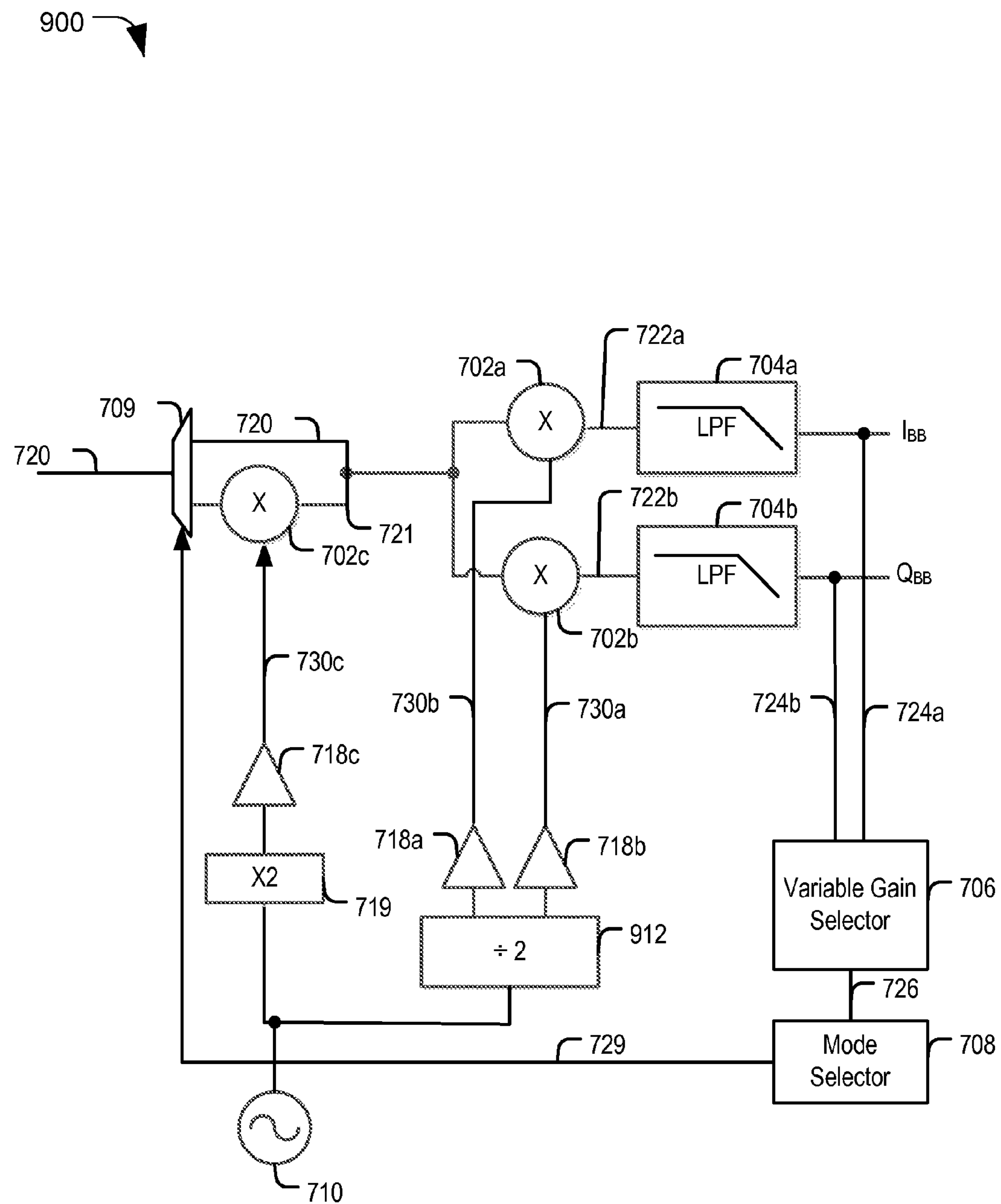
FIG. 9 is a block diagram of another particular illustrative embodiment of a sliding intermediate frequency system that includes harmonic selection to adjust a signal gain and that is operable in 60 GHz wireless gigabit receivers and 60 GHz wireless high-definition receivers.

Referring to FIG. 9, a particular illustrative embodiment of a sliding intermediate frequency system 900 operable in 60 GHz wireless receivers (e.g., a 60 GHz Wireless Gigabit receiver or a 60 GHz wireless high-definition receiver) is shown. In contrast to the phase shifter 712 of FIG. 7, a divider circuit 912 of FIG. 9 is configured to divide the VCO frequency ($f_{VCO}$) of the VCO signal 955 by two (e.g. a quadrature divide by two).

In the illustrative embodiment of FIG. 9, the VCO 710 generates a VCO signal 755 having a VCO frequency ($f_{VCO}$) approximately equal to 24 GHz and the multiplier circuit 719 and the third LO buffer 718*c* generate a third LO signal 730*c* having a frequency approximately equal to 48 GHz. The divider circuit 912 and the first and second LO buffers 718*a*, 718*b* divide the VCO frequency ($f_{VCO}$) of the VCO signal 955 by two and generate a first and second LO signal 730*a*, 730*b* having an LO frequency ($f_{LO}$) approximately equal to half of the VCO frequency ($f_{VCO}$) (e.g., $f_{LO}$=12 GHz). Thus, when the system 900 operates in a sliding IF dual conversion mode, the RF signal 720 is mixed by the third LO signal 730*c* (e.g., two times the VCO frequency ($f_{VCO}$)) and then mixed by the first and second LO signals 730*a*, 730*b* (e.g., one-half of the VCO frequency ($f_{VCO}$)) at the first and second mixers 702*a*, 702*b*, respectively. When the system 900 operates in a sub-harmonic conversion mode, the RF signal 720 is mixed at the first and second mixers 702*a*, 702*b* with the first and second LO signals 730*a*, 730*b*, respectively, and the relative conversion gain of the mixer is approximately −20 log 5, or −13.98 dB.

Figure 10:
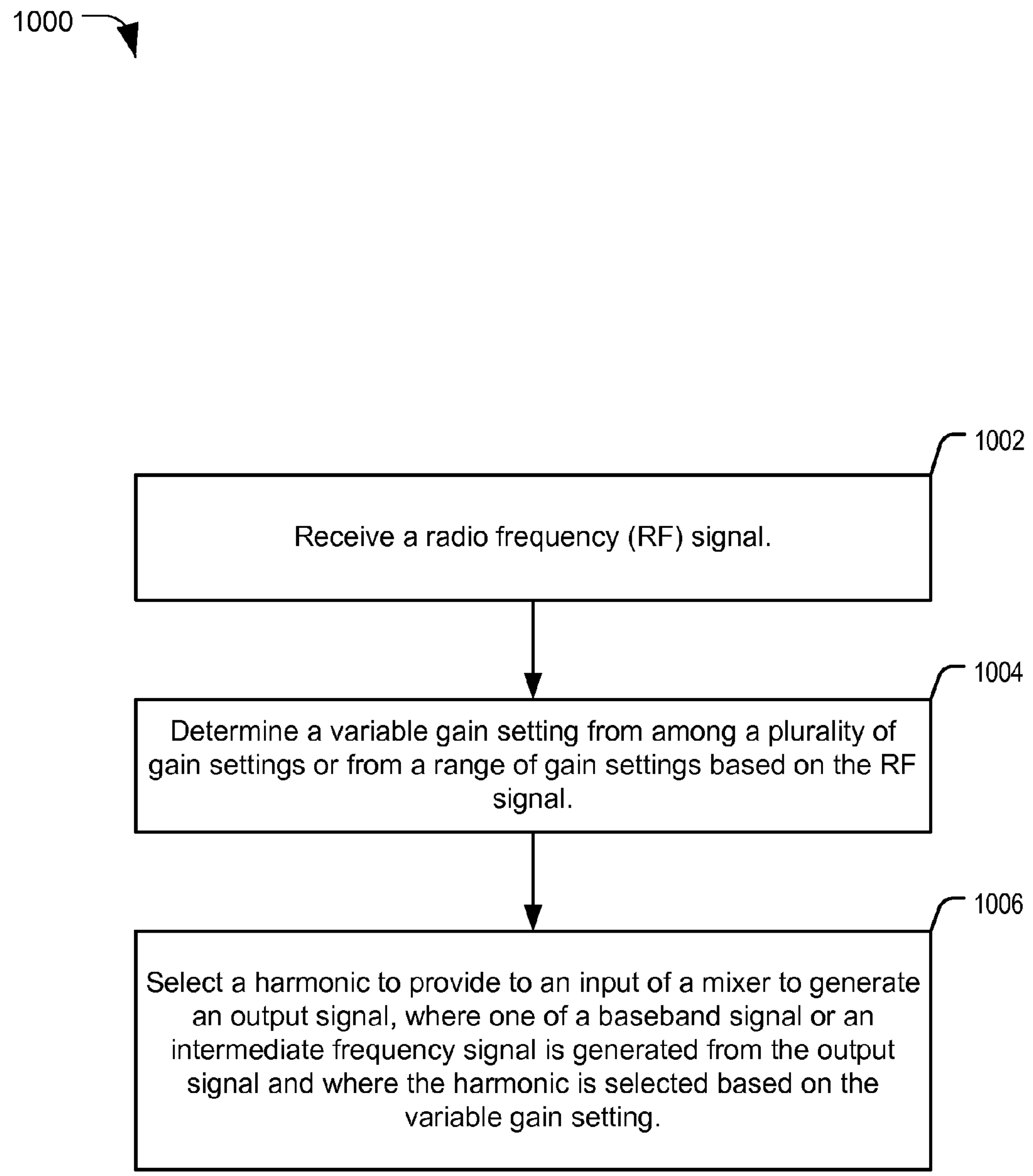
FIG. 10 is a flowchart of a particular embodiment of a method of harmonic selection for mixing with a received signal.

Referring to FIG. 10, a method 1000 of harmonic selection for mixing with a received signal is shown. In an illustrative embodiment, the method 1000 may be performed by any of the systems 100-900 of FIGS. 1-9.

The method 1000 includes receiving a radio frequency (RF) signal, at 1002. For example, in FIG. 1, the mixer 102 may receive the RF signal 120. A variable gain setting may be determined from among a plurality of gains settings or from a range of gain settings based on the RF signal, at 1004. For example, in FIG. 1, the harmonic selector 108 may receive the strength indicator signal 126 from the signal strength detector 106 and determine a variable gain setting based on the strength indicator signal 126. The variable gain setting may correspond to a particular harmonic of the LO signal 130 that, when applied to the mixer 102 along with the RF signal 120, results in the output signal 122 having a selected gain. In a particular embodiment, determining the variable gain setting includes taking a signal strength measurement corresponding to a power level of the RF signal 120. The harmonic selector 108 may select a gain setting (i.e., a variable gain setting) from among a plurality of discrete gain settings. Alternatively, the harmonic selector 108 may select a gain setting from among a continuous range of gain settings and compare the selected gain setting to one or more gain levels that may be provided by harmonics that are generated at the adjustable LO generator 110.

A harmonic is selected to provide to an input of a mixer to generate an output signal, at 1006. For example, in FIG. 1, the harmonic selector 108 may select a harmonic 114 based on the selected variable gain setting 113 and may generate a control signal 128 that indicates the selected harmonic 114. The adjustable LO 110 may receive the control signal 128, generate a LO signal 130 having a LO frequency ($f_{LO}$) that corresponds to the harmonic selected by the harmonic selector 108, and provide the LO signal 130 to the input of the mixer 102. The mixer 102 mixes the LO signal 130 with the RF signal 120 to generate an output signal 122. The filter 104 may generate the filtered output signal 124 (i.e., the baseband signal or the intermediate frequency signal) from the output signal 122. In a particular embodiment, the RF signal 120 may be provided to a first input of the mixer 102 and the local oscillator signal 130 may be provided to a second input of the mixer 102. Selecting the harmonic may include adjusting a frequency of the local oscillator signal 130.

In a particular embodiment, a first VCO signal having a first VCO frequency that is substantially an integer multiple of a carrier frequency of the RF signal may be generated. For example, in FIG. 2, the VCO 210 may generate the VCO signal 255 having a VCO frequency ($f_{VCO}$) that is substantially two times the carrier frequency ($f_C$) of the RF signal 220 (e.g., $f_{VCO}$=2*850 MHz). The VCO signal 255 provided to the harmonic divider circuit 216 (i.e., an adjustable frequency divider). Adjusting the LO frequency ($f_{LO}$) of the first and second LO signals 230*a*, 230*b* may include adjusting the control signal 228 to the harmonic divider circuit 216.

In another particular embodiment, adjusting the frequency of the local oscillator signal may include generating a second VCO signal having a second VCO frequency that is substantially an integer multiple of a frequency of the harmonic. For example, a resonant-type VCO may be operated to generate a first VCO signal having a first VCO frequency that is substantially an integer multiple of a carrier frequency based on a measured signal strength corresponding to the RF signal. For example, in FIG. 3, the first VCO 310*a* (i.e., a resonant-type VCO) may generate the first VCO signal 355*a* having a first VCO frequency ($f_{VCO1}$) that is equal to twice the carrier frequency ($f_C$) (e.g., $f_{VCO1}$=2*850 MHz) when the measured signal strength of the RF signal 320 corresponds to a relatively low signal strength. As another example, the VCO may be tunable to generate a first VCO signal having a first VCO frequency that is substantially an integer multiple of a carrier frequency of the RF signal, such as depicted in FIG. 4. For example, in FIG. 4, the VCO 410 may be tunable to generate the VCO signal 455 having a VCO frequency ($f_{VCO1}$) that is two times the carrier frequency ($f_C$) of the RF signal 420.

In another particular embodiment, adjusting the frequency of the local oscillator signal may include generating an output signal at a VCO and selecting the local oscillator signal from either the output signal of the VCO divided by an integer (n) or the output signal of the VCO multiplied by ((n−1)/n). For example, in FIG. 6, the VCO 610 may generate a VCO signal 655 having a VCO frequency ($f_{VCO}$) equal to 3200 MHz. Where n=4, the switch 616 may select the first signal 625 having a frequency equal to approximately the VCO frequency ($f_{VCO}$) divided by four (e.g., 800 MHz) or the switch 616 may select the second signal 625 equal to approximately the VCO frequency ($f_{VCO}$) multiplied by 0.75 (e.g., 2400 MHz).

In another particular embodiment, adjusting the frequency of the local oscillator signal may include generating an output signal at a VCO and selecting the local oscillator signal from either the output signal of the VCO divided by an integer (n) or the output signal of the VCO multiplied by ((n+1)/n). For example, in FIG. 6, the VCO 610 may generate a VCO signal 655 having a VCO frequency ($f_{VCO}$) equal to 3200 MHz. Where n=2, the switch 616 may select the first signal 625 having a frequency equal to approximately the VCO frequency ($f_{VCO}$) divided by two (e.g., 1600 MHz) or the switch 616 may select the second signal 625 equal to approximately the VCO frequency ($f_{VCO}$) multiplied by 3/2 (e.g., 4800 MHz).

In another particular embodiment, a local oscillator signal may be provided to a second input of the mixer and selecting the harmonic may include selecting whether to provide the RF signal or an intermediate frequency (IF) signals derived from the RF signal to the first input of the mixer. For example, in FIG. 7, the first LO signal 730*a* may be provided to the second input of the first mixer 702*a* and the second LO signal 730*b* may be provided to the second input of the second mixer 702*b*. The switch 709 may be configured to provide the RF signal 720 having a carrier frequency ($f_C$) of 60 GHz to be provided to the first input of the first mixer 702*a* and to the first input of the second mixer 702*b* based on the control signal 729 provided to the selection input of the switch 709. Alternatively, the switch 709 may be configured to provide the output signal 721 having an intermediate frequency ($f_{IF}$) of 20 GHz to be provided to the first input of the first mixer 702*a* and to the first input of the second mixer 702*b* based on the control signal 729 provided to the selection input of the switch 709. The output signal 721 may be derived from the RF signal 720.

It will be appreciated that the method 1000 may adjust the gain of the output signal 102 using harmonics and may reduce power consumption. For example, each selected harmonic other than the fundamental has a lower mixer conversion gain than the fundamental and use of a gain reduction may be avoided (or an amount of gain reduction provided by a gain reduction stage may be reduced), thereby saving power and reducing battery drain. Additionally, when the selected harmonic is higher than the fundamental, for the same carrier frequency the local oscillator buffers and dividers run at a lower frequency, saving power and reducing battery drain. Further, the method 1000 may be used in receivers designed to receive strong signals and weak signals.

Figure 11:
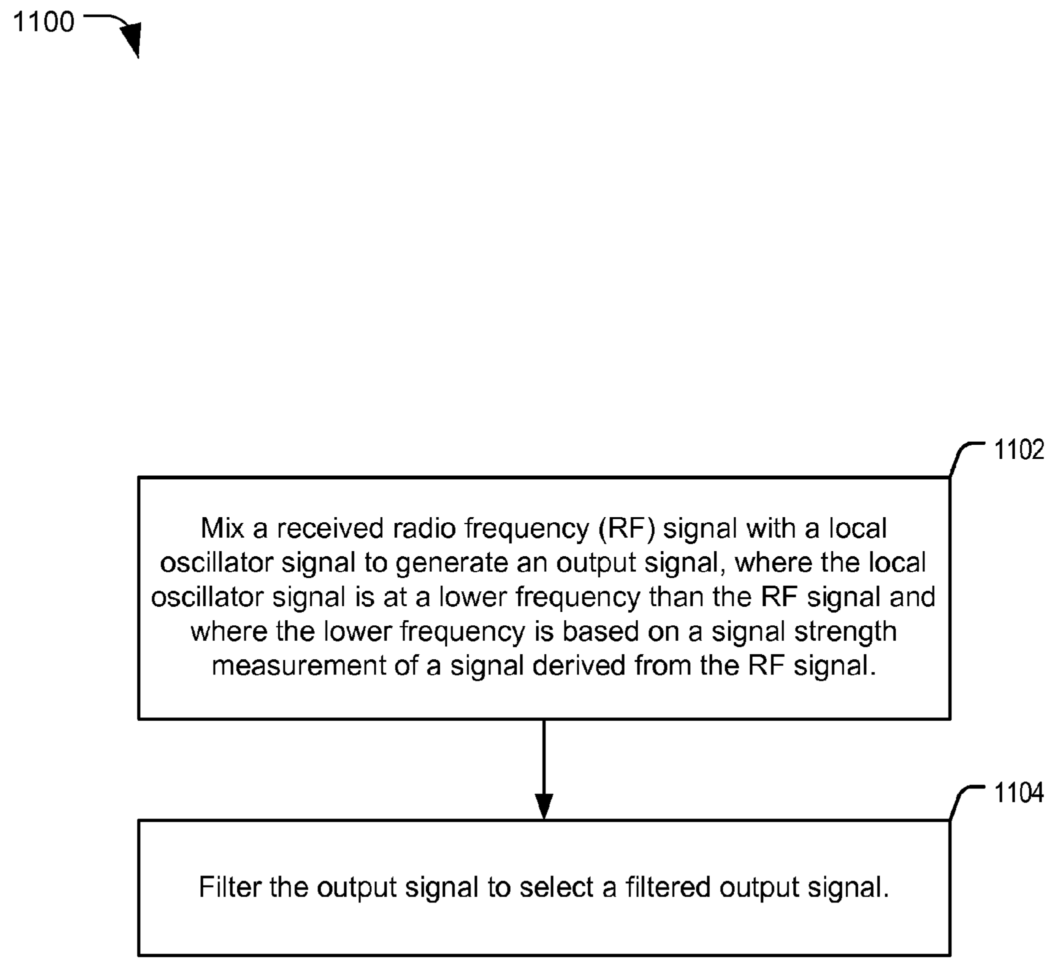
FIG. 11 is a flowchart of a particular embodiment of a method of adjusting a gain of a signal using harmonics.

Referring to FIG. 11, a method 1100 for adjusting a gain of a signal is shown. In an illustrative embodiment, the method 1100 may be performed by any of the systems 100-900 of FIGS. 1-9.

The method 1100 includes mixing a radio frequency (RF) signal with a local oscillator signal to generate an output signal, at 1102. For example, in FIG. 1, the mixer 102 may mix the RF signal 102 with the LO signal 130 to generate the output signal 122. The LO signal 130 may be at a lower frequency than the RF signal 120 and the lower frequency may be based on a measured signal strength corresponding to the RF signal 120. For example, the signal strength detector 106 may measure the signal strength of the filtered output signal 124 and may generate a strength indicator signal 126 indicating the signal strength of the filtered output signal 124. The signal strength of the filtered output signal 124 may correspond to a signal strength of the RF signal 120 received by the mixer 102. For example, as the signal strength of the RF signal 120 increases, the signal strength of the filtered output signal 124 may also increase. In addition, as the signal strength of the RF signal 120 decreases, the signal strength of the filtered output signal 124 may also decrease. The harmonic selector 108 may select a variable gain setting based on the strength indicator signal 126 select a harmonic or frequency corresponding to the selected gain setting. The adjustable LO 110 may generate the LO signal 130 having the LO frequency ($f_{LO}$) that corresponds to the harmonic selected by the harmonic selector 108. For example, the LO frequency ($f_{LO}$) may be equal to a fraction of the carrier frequency ($f_C$) corresponding to a selected harmonic. For example, if the selected harmonic is a third harmonic, the LO frequency ($f_{LO}$) of the LO signal may be equal to equal to one-third the carrier frequency ($f_C$) (e.g., $f_{LO}=f_C/3$).

The output signal may be filtered to select a filtered output signal, at 1104. For example, the LPF 104 may filter the output signal 122 to generate the filtered output signal 124.

It will be appreciated that the method 1100 may adjust the gain of the output signal 102 using harmonics and may reduce power consumption. For example, each selected harmonic other than the fundamental has a lower mixer conversion gain fundamental and use of a gain reduction may be avoided (or an amount of gain reduction provided by a gain reduction stage may be reduced), thereby saving energy and reducing battery drain.

Figure 12:
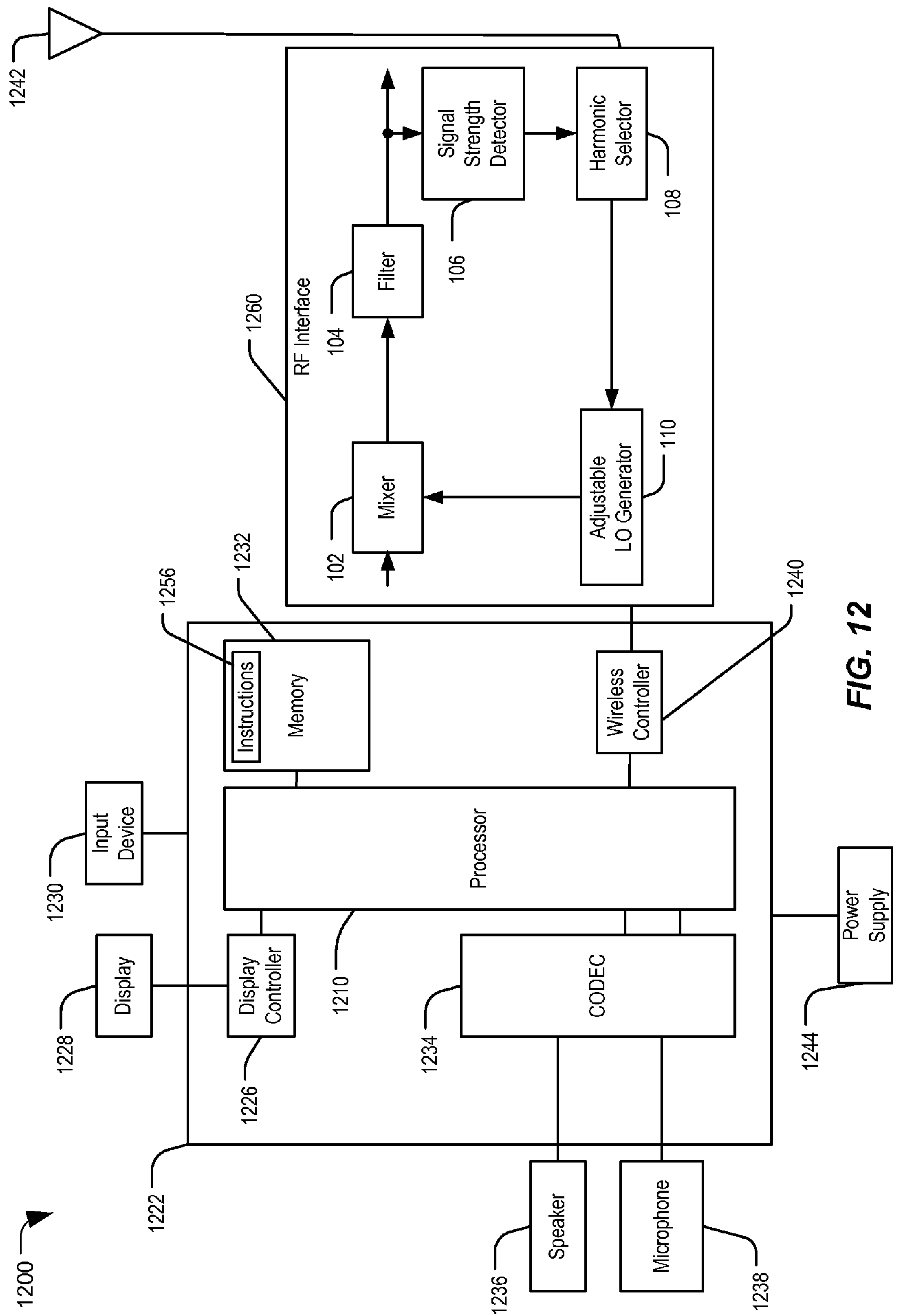
FIG. 12 is a block diagram of a wireless device including a system operable to adjust a gain of a signal using harmonics.

Referring to FIG. 12, a block diagram of a particular illustrative embodiment of a wireless communication device is depicted and generally designated 1200. The device 1200 includes a radio-frequency (RF) interface 1260 that is configured receive a radio frequency signal and determine a variable gain setting from among a plurality of gain setting or from a range of gain settings. The RF interface 1260 is further configured to select a harmonic to provide to an input of a mixer to generate a resulting signal that includes a baseband signal. The harmonic may be based on the variable gain setting. For example, the RF interface 1260 may include the mixer 102, the filter 104, the signal strength detector 106, the harmonic selector 108, and the adjustable LO generator 110 of FIG. 1. The device 1200 also includes a processor 1210, such as a digital signal processor (DSP), coupled to a memory 1232.

FIG. 12 also shows a display controller 1226 that is coupled to the processor 1210 and to a display 1228. A coder/decoder (CODEC) 1234 can also be coupled to the processor 1210. A speaker 1236 and a microphone 1238 can be coupled to the CODEC 1234. A wireless controller 1240 can be coupled to the processor 1210 and to the RF interface 1260. In a particular embodiment, the radio frequency (RF) interface 1260 may be disposed between the wireless controller 1240 and a wireless antenna 1242.

The memory 1232 may be a tangible non-transitory processor-readable storage medium that includes executable instructions 1256. The instructions 1256 may be executed by a processor, such as the processor 1210, to determine a variable gain setting from a plurality of gain settings or from a range of gain settings. Alternatively, the harmonic selector 108 may include instructions executed by a processor included in the harmonic selector 108 to determine the variable gain setting based on the strength indicator signal 126 provided by the signal strength detector 106. In alternate embodiments, the harmonic selector 108 may include a state machine and/or other circuitry configurable to determine the variable gain setting. The instructions 1256 may also be executable by a processor, such as the processor 1210 or the processor included in the harmonic selector 108, to select a harmonic to provide to an input of the mixer 102 to generate a resulting signal that includes a baseband signal, as described with respect to FIGS. 1-11. The harmonic may be selected based on the variable gain setting. In other embodiments, the executable instructions 1256 may be executable by a processor in the wireless controller 1240 or a processor otherwise programmed to determine a variable gain setting and to select a harmonic to provide to an input of a mixer, as described with respect to FIGS. 1-11.

In a particular embodiment, the processor 1210, the display controller 1226, the memory 1232, the CODEC 1234, and the wireless controller 1240 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display 1228, the input device 1230, the speaker 1236, the microphone 1238, the wireless antenna 1242, and the power supply 1244 are external to the system-on-chip device 1222. However, each of the display 1228, the input device 1230, the speaker 1236, the microphone 1238, the wireless antenna 1242, and the power supply 1244 can be coupled to a component of the system-on-chip device 1222, such as an interface or a controller.

In conjunction with the described embodiments, an apparatus is disclosed that includes means for determining a variable gain setting corresponding to a received radio frequency signal from among a plurality of gain settings or from a range of gain settings. For example, the means for determining a variable gain setting corresponding to a received radio frequency signal from among a plurality of gain settings or from a range of gain settings may include harmonic selector 108 of FIG. 1, the variable gain selector 206 of FIG. 2, the oscillator selector 308 of FIG. 3, the harmonic selector 408 of FIG. 4, the harmonic selector 508 of FIG. 5, the variable gain selector 606 of FIG. 6, the variable gain selector 706 of FIGS. 7-9, the processor 1210 of FIG. 12 configured to execute the instructions 1256 of FIG. 12, one or more other devices, circuits, modules, or processing devices to determine a variable gain setting corresponding to a received radio frequency, or any combination thereof.

The apparatus may also include means for selecting a harmonic to provide to an input of a mixer to generate a resulting signal that includes a baseband signal, where the harmonic is selected based on the variable gain setting. For example, the means for selecting a harmonic to provide to an input of a mixer to generate a resulting signal that includes a baseband signal may include the harmonic selector 108 of FIG. 1, the harmonic selector 208 of FIG. 2, the oscillator selector 308 of FIG. 3, the harmonic selectors 408-608 of FIGS. 4-6, the mode selectors 708 of FIGS. 7-9, the processor 1210 of FIG. 12 configured to execute the instructions 1256 of FIG. 12, one or more other devices, circuits, modules, or processing devices to select a harmonic to provide to an input of a mixer to generate a resulting signal that includes a baseband signal, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of harmonic selection for mixing with a received signal, the method comprising:

receiving a radio frequency (RF) signal;

determining a variable gain setting from among a plurality of gain settings or from a range of gain settings based on the RF signal; and selecting a harmonic to provide to an input of a mixer to generate an output signal, wherein one of a baseband signal or an intermediate frequency signal is generated from the output signal and wherein the harmonic is selected based on the variable gain setting.

2. The method of claim 1, wherein determining the variable gain setting from among the plurality of gain settings comprises:

taking a signal strength measurement corresponding to the RF signal;

determining whether the signal strength measurement exceeds a first threshold value;

in response to a determination that the signal strength measurement exceeds the first threshold value, selecting a first setting from the plurality of gain settings; and in response to a determination that the signal strength measurement fails to exceed the first threshold value, selecting a second setting from the plurality of gain settings;

wherein the variable gain setting is the first setting when the signal strength measurement exceeds the first threshold value and wherein the variable gain setting is the second setting when the signal strength measurement fails to exceed the first threshold value.

3. The method of claim 1, wherein determining the variable gain setting from the range of gain settings comprises:

taking a signal strength measurement corresponding to the RF signal;

dividing a reference signal strength value by the signal strength measurement to obtain a first variable gain setting; and adjusting the first variable gain setting to a value within the range of gain settings to obtain the variable gain setting.

4. The method of claim 1, wherein the RF signal is provided to a first input of the mixer and a local oscillator signal is provided to a second input of the mixer, and further comprising adjusting a frequency of the local oscillator signal based on the selected harmonic.

5. The method of claim 4, further comprising generating, at a voltage controlled oscillator (VCO), a first VCO signal having a first VCO frequency that is substantially an integer multiple of a carrier frequency of the RF signal, wherein the first VCO signal is input to a harmonic divider, and wherein the frequency of the local oscillator signal is adjusted based on a control signal to the harmonic divider.

6. The method of claim 4, wherein adjusting the frequency of the local oscillator signal includes generating, at a voltage controlled oscillator (VCO), a second VCO signal having a second VCO frequency that is substantially an integer multiple of a frequency of the harmonic.

7. The method of claim 6, wherein, based on a signal strength measurement, a resonant-type VCO is operated to generate a first VCO signal having a first VCO frequency that is substantially an integer multiple of a carrier frequency of the RF signal or the VCO is operated to generate the second VCO signal, wherein the VCO is a ring oscillator-type VCO.

8. The method of claim 6, wherein the VCO is tunable to generate a first VCO signal having a first VCO frequency that is substantially an integer multiple of a carrier frequency of the RF signal or to generate the second VCO signal.

9. The method of claim 4, wherein adjusting the frequency of the local oscillator signal includes generating an output signal at a voltage controlled oscillator (VCO) and selecting the local oscillator signal from either the output signal of the VCO divided by an integer n or the output signal of the VCO multiplied by ((n+1)/n).

10. The method of claim 4, wherein adjusting the frequency of the local oscillator signal includes generating an output signal at a voltage controlled oscillator (VCO) and selecting the local oscillator signal from either the output signal of the VCO divided by an integer n, or the output signal of the VCO multiplied by ((n−1)/n).

11. The method of claim 1, wherein a local oscillator signal is provided to a second input of the mixer and wherein selecting the harmonic includes selecting whether to provide the RF signal or the intermediate frequency signal to the first input of the mixer.

12. The method of claim 11, wherein the IF signal derived from the RF signal is generated by applying the RF signal to a first input of a second mixer and applying a harmonic of the local oscillator signal to a second input of the second mixer.

13. An apparatus to select a harmonic for mixing with a received signal, the apparatus comprising:

a harmonic selector configured to generate a control signal indicative of a selected harmonic, wherein the harmonic is selected based on a variable gain setting determined from among a plurality of gain settings or from a range of gain settings; and a mixer configured to generate an output signal based on the selected harmonic, wherein one of a baseband signal or an intermediate signal is generated from the output signal.

14. The apparatus of claim 13, further comprising a signal strength detector configured to determine a signal strength measurement, wherein the variable gain setting is determined based on the signal strength measurement.

15. The apparatus of claim 14, wherein a radio frequency (RF) signal is provided to a first input of the mixer and a local oscillator signal is provided to a second input of the mixer, wherein a frequency of the local oscillator signal is adjusted in response to the indication of the selected harmonic.

16. The apparatus of claim 15, further comprising a voltage controlled oscillator (VCO) configured to generate a VCO signal having a VCO frequency that is substantially an integer multiple of a frequency of the selected harmonic.

17. The apparatus of claim 16, wherein the local oscillator signal is generated based on the VCO signal.

18. An apparatus comprising:

means for determining a variable gain setting corresponding to a received radio frequency (RF) signal from among a plurality of gain settings or from a range of gain settings; and means for selecting a harmonic to provide to an input of a mixer to generate an output signal, wherein one of a baseband signal or an intermediate frequency signal is generated from the output signal and wherein the harmonic is selected based on the variable gain setting.

19. The apparatus of claim 18, wherein the means for determining includes means for measuring a signal strength corresponding to the RF signal.

20. The apparatus of claim 18, further comprising means for mixing the RF signal and a local oscillator signal.

21. The apparatus of claim 20, wherein the means for selecting the harmonic includes means for adjusting a frequency of the local oscillator signal.

22. A non-transitory computer readable storage medium comprising instructions to select a harmonic for mixing with a received signal, wherein the instructions, when executed by a processor, cause the processor to:

determine a variable gain setting from a plurality of gain settings or from a range of gain settings; and select a harmonic to provide to an input of a mixer to generate an output signal, wherein one of a baseband signal or an intermediate frequency signal is generated from the output signal and wherein the harmonic is selected based on the variable gain setting.

23. The non-transitory computer readable storage medium of claim 22, further comprising instructions that, when executed by the processor, cause the processor to determine a signal strength measurement corresponding to a radio frequency (RF) signal.

24. The non-transitory computer readable storage medium of claim 23, wherein the variable gain is determined based on the signal strength measurement.

25. The non-transitory computer readable storage medium of claim 23, wherein a local oscillator signal is provided to the mixer and wherein selecting the harmonic includes selecting whether to provide the RF signal or an intermediate frequency (IF) signal derived from the RF signal to the mixer.

* * * * *